United States Patent
Dong et al.

(10) Patent No.: US 12,355,347 B2
(45) Date of Patent: Jul. 8, 2025

(54) POWER SUPPLY DEVICE

(71) Applicant: Delta Electronics (Shanghai) Co., Ltd., Shanghai (CN)

(72) Inventors: Kai Dong, Shanghai (CN); Bing Fan, Shanghai (CN); Dongyu Wang, Shanghai (CN); Weibo Sun, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 174 days.

(21) Appl. No.: 18/209,010

(22) Filed: Jun. 13, 2023

(65) Prior Publication Data

US 2024/0048047 A1 Feb. 8, 2024

(30) Foreign Application Priority Data

Aug. 2, 2022 (CN) .......................... 202210921984.1

(51) Int. Cl.
*H02M 3/00* (2006.01)
*H01F 27/24* (2006.01)
(Continued)

(52) U.S. Cl.
CPC ............ *H02M 3/003* (2021.05); *H01F 27/24* (2013.01); *H02M 3/33576* (2013.01); *H05K 1/115* (2013.01); *H05K 2201/1003* (2013.01)

(58) Field of Classification Search
CPC ...... H02M 3/003; H02M 1/0048; H02M 3/01; H05K 2201/1003; H05K 2201/10015;
(Continued)

(56) References Cited

U.S. PATENT DOCUMENTS

2009/0161326 A1* 6/2009 Lin .......................... G06F 1/26
361/752
2015/0048917 A1* 2/2015 Uchiyama ............ H05K 1/0209
336/200
(Continued)

FOREIGN PATENT DOCUMENTS

CN 105099131 B 1/2018
CN 110828126 A 2/2020
(Continued)

*Primary Examiner* — Sherman Ng
(74) *Attorney, Agent, or Firm* — KIRTON McCONKIE; Evan R. Witt

(57) ABSTRACT

A power supply device is disclosed and includes a housing, a power board, an output terminal and a DCDC conversion module. The housing includes an accommodation space, and a first opening of a rear plate in communication with the accommodation space. The power board disposed in parallel to the lower plate is at least partially accommodated in the accommodation space, and a peripheral edge is disposed adjacent to the rear plate. The output terminal is disposed in parallel to the lower plate, and passes through the first opening of the rear plate. The DCDC conversion module is accommodated in the accommodation space and includes a primary circuit, a transformer and a secondary circuit. The transformer and the secondary circuit are arranged on the power board in sequence. The secondary circuit is arranged on part of the power board existing the peripheral edge and electrically connected to the output terminal.

22 Claims, 17 Drawing Sheets

(51) Int. Cl.
*H02M 3/335* (2006.01)
*H05K 1/11* (2006.01)
*H05K 7/14* (2006.01)

(58) Field of Classification Search
CPC .................. H05K 1/165; H05K 7/1432; H01F 2027/2819; H01F 27/06; H01F 27/2804; H01F 2027/065
See application file for complete search history.

(56) References Cited

U.S. PATENT DOCUMENTS

2015/0131353 A1\* 5/2015 Nakajima ............ H05K 7/2039
363/141
2021/0066170 A1 3/2021 Ji et al.

FOREIGN PATENT DOCUMENTS

| | | | |
|---|---|---|---|
| CN | 112104202 | A | 12/2020 |
| CN | 113345694 | A | 9/2021 |
| CN | 214476881 | U | 10/2021 |
| JP | 2016009704 | A | 1/2016 |

\* cited by examiner

POWER SUPPLY DEVICE

CROSS-REFERENCE TO RELATED APPLICATION

This application claims priority to China Patent Application No. 202210921984.1, filed on Aug. 2, 2022. The entire contents of the above-mentioned patent application are incorporated herein by reference for all purposes.

FIELD OF THE INVENTION

The present disclosure relates to a technology field of power electronic devices, and more particularly to a communication and server power supply device for optimizing the arrangement of a planar transformer, increasing the power rating of the transformer, and reducing the line loss.

BACKGROUND OF THE INVENTION

As an essential part of power conversion, modern power electronic devices are wildly used in power, electronic, electrical machinery and energy industries. With the development of power electronic technology, higher requirements are put forward for the power level, the power density and the modularity of the high-power switching power supply.

Most of the conventional high-density power supply devices have used planar transformers to replace wound transformers to improve the power density. However, the PCB with the planar transformer is vertically inserted on the power mainboard. In that, the bus capacitors in the conventional communication and server power supply devices need to be electrically connected with the power motherboard through another additional PCB, so as to electrically connect to the PCB with the planar transformer disposed thereon.

In other words, there are three connection interfaces provided in the conventional communication and server power supply device for the electrical connection from the bus capacitor to the planar-transformer PCB. That is, a first connection interface is used to connect the bus capacitor to the capacitor PCB, a second connection interface is used to connect the capacitor PCB to the power mainboard, and a third connection interface is used to connect the power mainboard to the planar-transformer PCB. Furthermore, since all the output current of the power supply device is transmitted to the load through the power output interface, the line loss is likely to occur at the connection interface. Therefore, gold fingers formed by laying copper in the PCB are widely used for the output power interface. In order to match the height of the external terminals, the PCB with the gold fingers is not coplanar to power mainboard. The gold fingers and the power mainboard need to be electrically connected through additional metal conductors. In that, the planar-transformer PCB and the output interface of gold fingers need to be connected to each other through two connection interfaces. That is, one connection interface is used to connect the planar-transformer PCB to the power mainboard, and another connection interface is used to connect the power mainboard to the output interface of gold fingers. Furthermore, in the case of high current, the aforementioned complicated connection method leads to a large line resistance, and it results in a high loss.

On the other hand, in the conventional communication and server power supply device, the planar-transformer PCB is vertically inserted on the power motherboard. The length of the planar transformer is easily limited by the height of the housing of the power supply device. It is not easy to enlarge the size of the magnetic core to increase the power, so that it is not conducive to the improvement of the power density.

Therefore, there is a need to provide a power supply device for optimizing the arrangement of a planar transformer, increasing the power rating of the transformer, and reducing the line loss at the same time, so as to address the above issues encountered by the prior arts.

SUMMARY OF THE INVENTION

An object of the present disclosure is to provide a power supply device for optimizing the arrangement of a planar transformer, increasing the power rating of the transformer, and reducing the line loss at the same time. When a DCDC conversion module is directly installed on a power board, an output terminal is directly formed by for example laying copper in part of the power board where a peripheral edge is located, or an output terminal is fixedly connected to the peripheral edge of the power board through a metal conductive sheet, so that the output terminal is allowed to pass through the housing and directly connect to an external terminal. Moreover, with the planar transformer directly integrated into the power board, it allows to omit the interface of connecting the planar-transformer board to the output terminal. On the other hand, when the transformer and the secondary circuit of the DCDC conversion module are sequentially arranged on the power board, it allows inserting the bus capacitor of the primary circuit into the power board through a bus-capacitor circuit board directly, thereby reducing the interface electrically connected to the transformer. Furthermore, it allows to stack the capacitor body of the bus capacitor over a first magnetic cover plate of the planar transformer, for example, along a first direction. Moreover, it also allows inserting other adjacent control boards and auxiliary power supply units on the power board directly to achieve the electrical connections, so as to further increase the power density.

Another object of the present disclosure is to provide a power supply device. By disposing a DCDC conversion module and an output terminal in a planar arrangement on the power board, the current flow path is decreased, the number of interfaces between the components is reduced, and the size limit of the transformer in the DCDC conversion module relative to the height of the housing is eased, so as to increase the power rating of the transformer. When the DCDC conversion module is directly disposed on the power board, the planarization of the transformer is helpful of expanding the horizontal size of the magnetic cover plate along the extension direction of the power board, so as to improve the power density. When the size of the magnetic cover plate of the transformer is enlarged, it is allowed to combine with for example a magnetic cover plate of a resonant inductor to form an integrated structure. It has advantages of simplifying the manufacturing and assembly process, reducing the costs, and can achieve the purpose of reducing line loss and reducing the number of interfaces. On the other hand, when the DCDC conversion module is directly installed on the power board, the output terminal of the power supply device is allowed to pass through the rear plate of the housing, and it allows combing a fan adjacent to the front panel of the housing to form an airflow channel in communication between the two opposite plates. It facilitates to dissipate the heat generated from the transformer, the power components and the heat-generating components in the DCDC conversion module. Furthermore, as opposed to the output terminal of the power supply device passing through the rear plate, the power board is extended toward the front plate or combined with an input board to integrate a voltage conversion module, an EMI module or input terminal components in the accommodation space of the housing, so as to improve the power density effectively and enhance the product competitiveness.

In accordance with an aspect of the present disclosure, a power supply device is provided and includes a housing, a power board, an output terminal and a DCDC conversion module. The housing includes an accommodation space, a rear plate and a lower plate. The rear plate includes a first opening, and the first opening is in communication with the accommodation space. The power board is disposed in parallel to the lower plate, at least partially accommodating in the accommodation space, and includes at least two first through-holes, a peripheral edge, a first side and a second side. The first side and the second side are opposite to each other, the at least two first through-holes are passed through the first side and the second side of the power board, and the peripheral edge is disposed adjacent to the rear plate. The output terminal is disposed in parallel to the lower plate, and passes through the first opening of the rear plate. The DCDC conversion module is accommodating in the accommodation space and includes a primary circuit, a transformer and a secondary circuit. The transformer and the secondary circuit are arranged on the power board in sequence, the secondary circuit is arranged on part of the power board existing the peripheral edge and electrically connected to the output terminal, and the transformer includes a transformer winding, at least two first magnetic columns, a first magnetic cover plate and a second magnetic cover plate. At least part of the transformer winding is formed by laying copper in the power board, the at least two first magnetic columns pass through the at least two first through-holes of the power board, respectively, and the first magnetic cover plate and the second magnetic cover plate are disposed correspondingly to the first side and the second side of the power board, respectively, and connected to each other through the at least two first magnetic columns. The primary circuit includes a bus capacitor, and a capacitor body of the bus capacitor is extended along a first direction and disposed on the first magnetic cover plate of the transformer, and the first direction is perpendicular to the rear plate.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
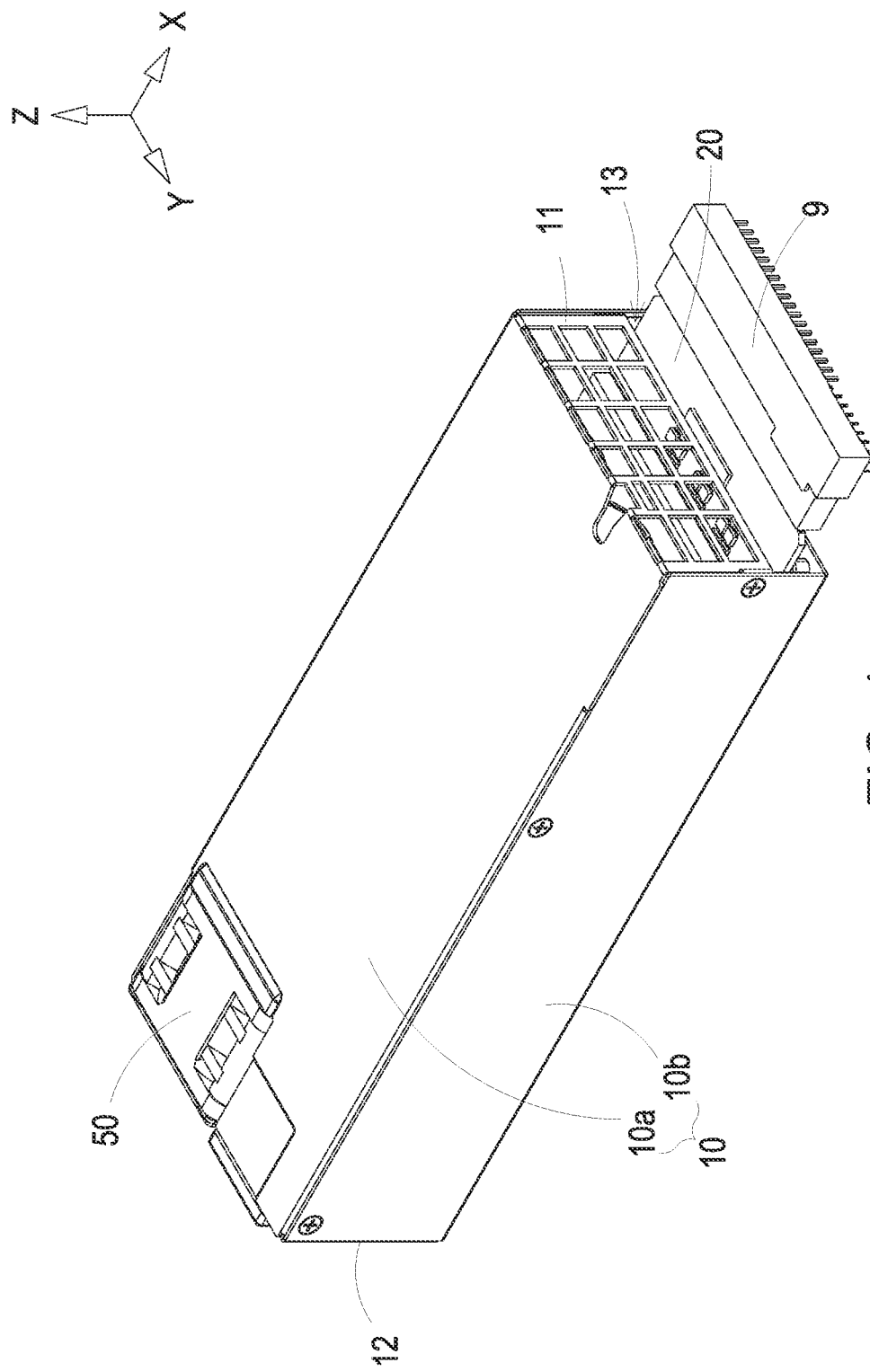
FIG. 1 is an exterior view illustrating a power supply device according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "lower," "upper," "lower," "front," "rear" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
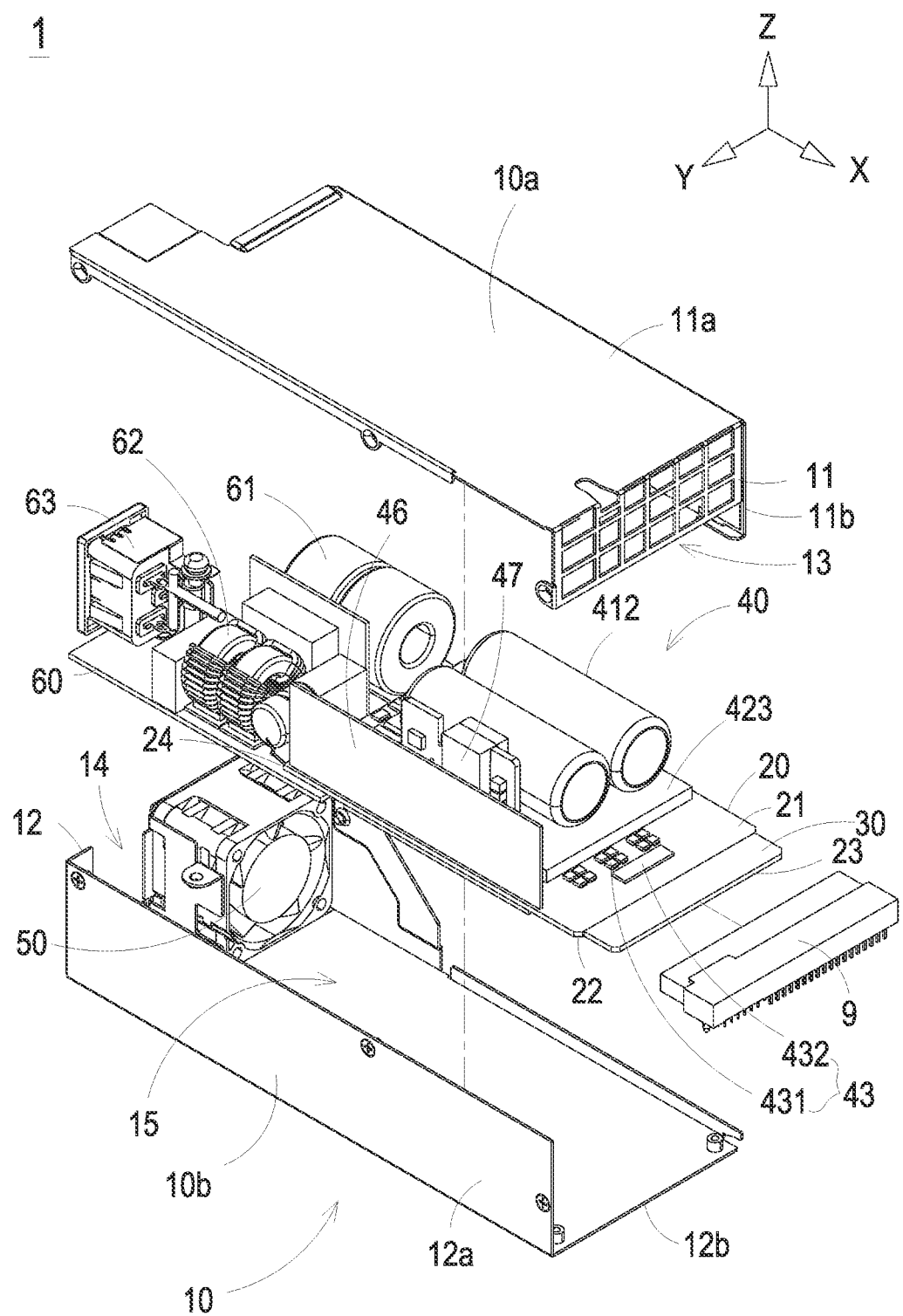
FIG. 2 is an exploded view illustrating the power supply device according to the first embodiment of the present disclosure.
Figure 3:
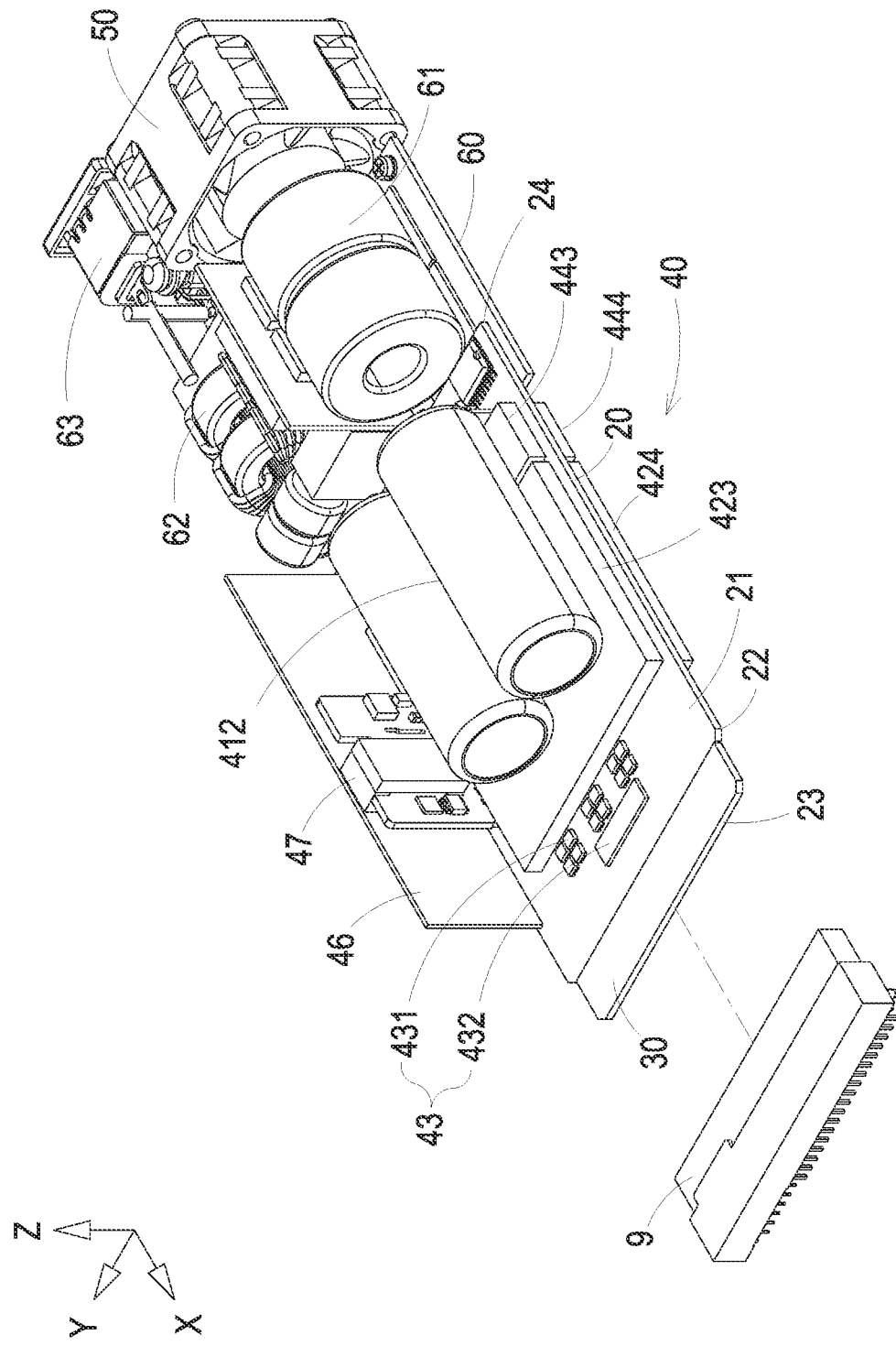
FIG. 3 is a schematic structural view illustrating the internal components of the power supply device according to the first embodiment of the present disclosure.
Figure 4:
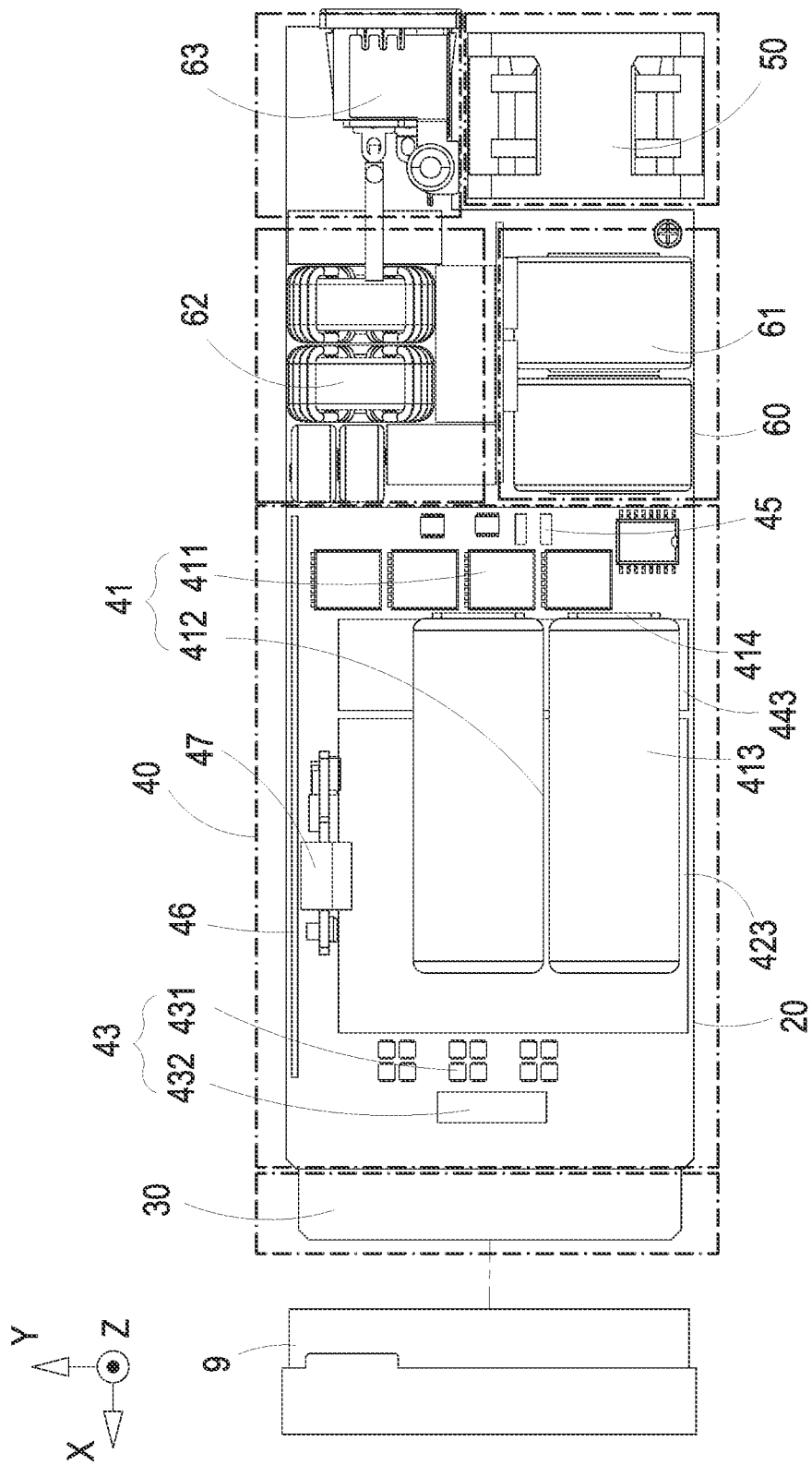
FIG. 4 is a top view of FIG. 3.
Figure 5:
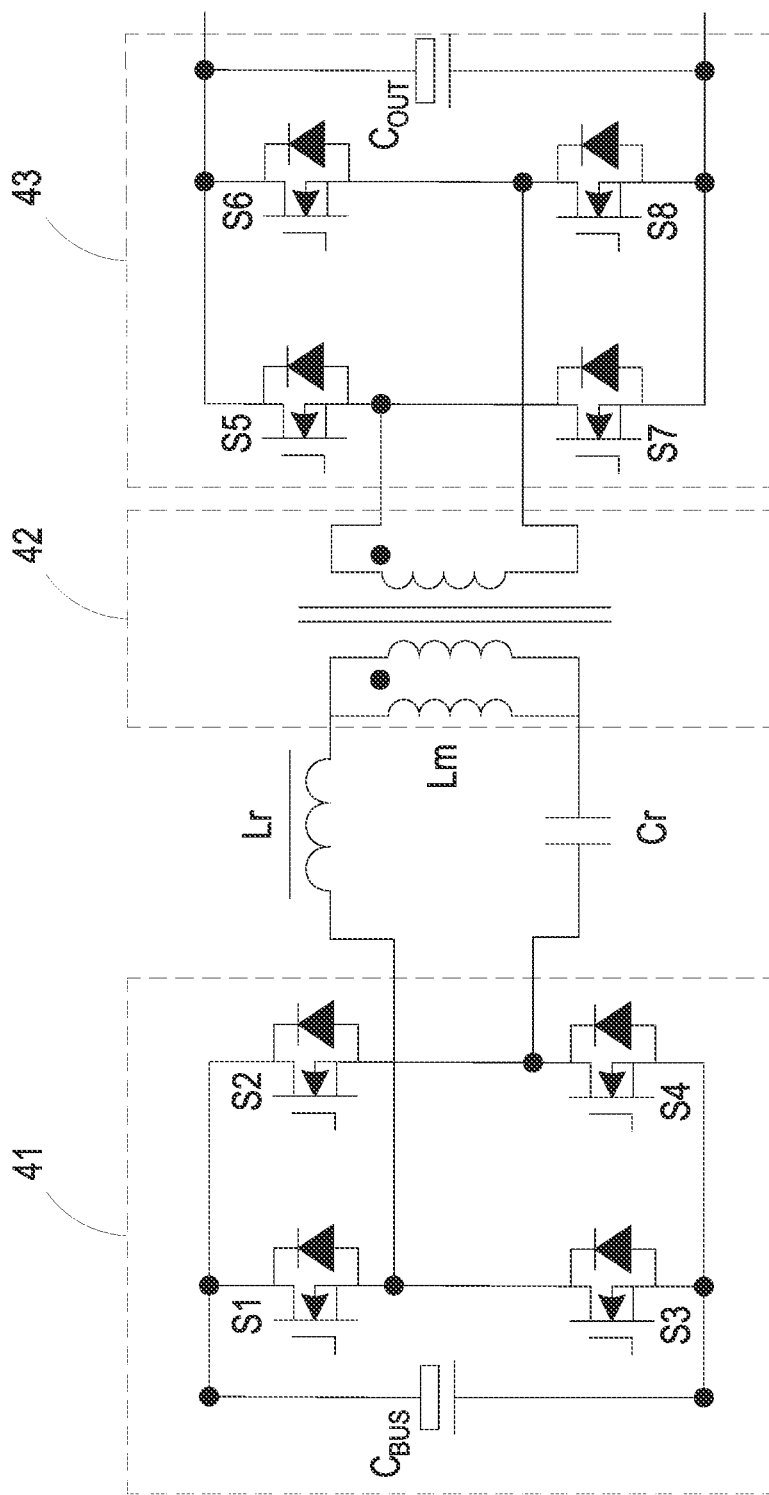
FIG. 5 schematically shows a first exemplary equivalent circuit diagram of the power supply device of the present disclosure.
Figure 6:
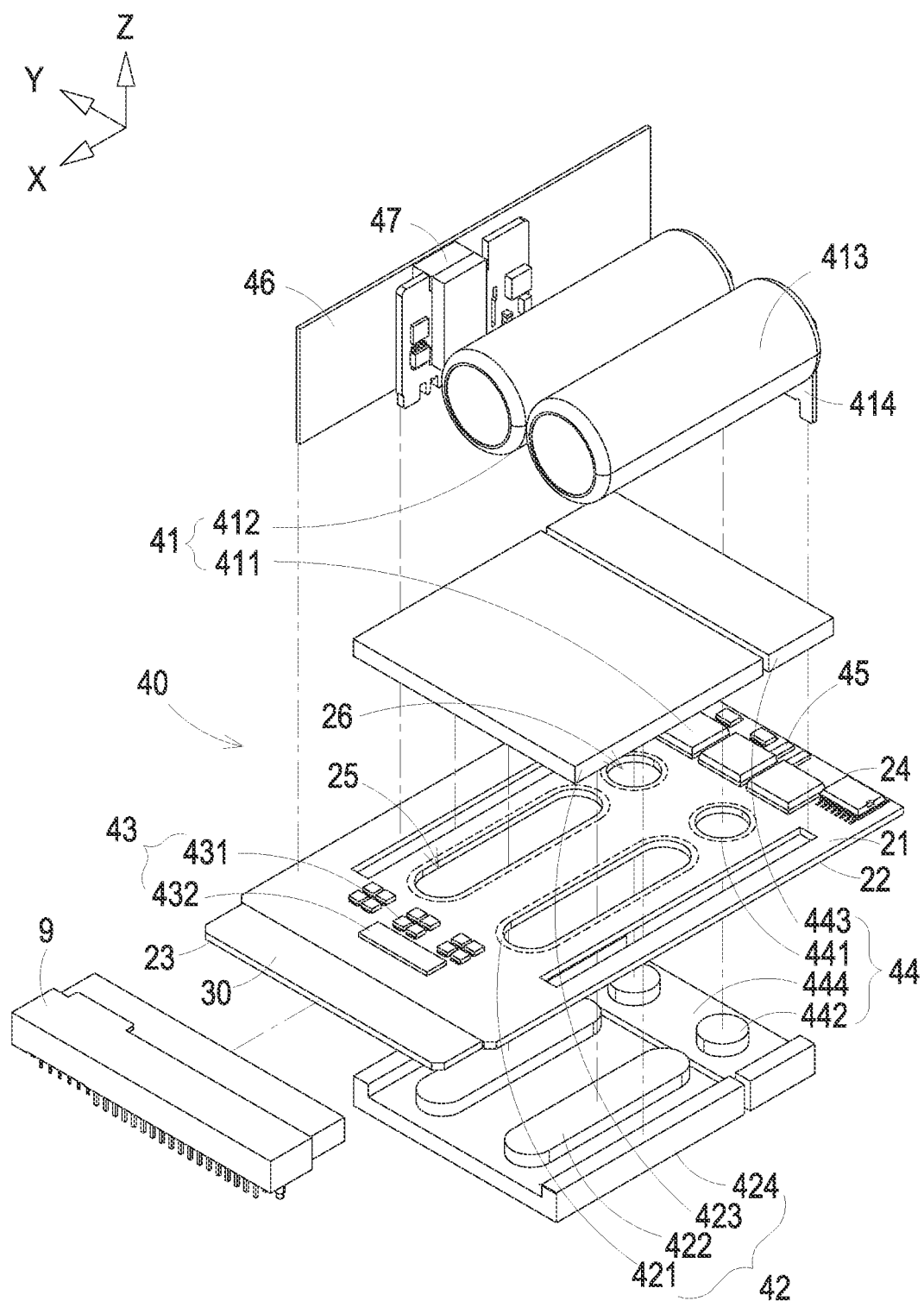
FIG. 6 is an exploded view illustrating the internal components of the power supply device according to the first embodiment of the present disclosure.

FIG. 1 is an exterior view illustrating a power supply device according to a first embodiment of the present disclosure. FIG. 2 is an exploded view illustrating the power supply device according to the first embodiment of the present disclosure. FIG. 3 is a schematic structural view illustrating the internal components of the power supply device according to the first embodiment of the present disclosure. FIG. 4 is a top view of FIG. 3. FIG. 5 schematically shows a first exemplary equivalent circuit diagram of the power supply device of the present disclosure. FIG. 6 is an exploded view illustrating the internal components of the power supply device according to the first embodiment of the present disclosure. The present disclosure provides a communication and server power supply device (referred to as a power supply device) 1 to reduce the line loss and reduce the number of interfaces through a planar arrangement. In the embodiment, the power supply device 1 includes a housing 10, a power board 20, an output terminal 30 and a DCDC conversion module 40. In an embodiment, the housing 10 includes an upper cover 10a and a lower cover 10b. Certainly, the combination and the shape of the housing 10 are not limited thereto. In other embodiments, the housing 10 is formed by a box body and a cover body, and the present disclosure is not limited thereto. In the embodiment, the housing 10, for example, is a rectangular housing extended along the X axial direction, and includes a rear plate 11 and a front plate 12 disposed opposite to each other. Moreover, the front plate 12 faces the rear plate 11 to define a first direction, that is, the X axial direction. In the embodiment, the housing 10 may further include an upper plate 11a and a lower plate 12b disposed opposite to each other in the second direction (i.e., the Z axial direction), and a left plate 11b and right plate 12a disposed opposite to each other in a third direction (i.e., the Y axial direction). An accommodation space 15 is collaboratively formed by the front plate 12, the rear plate 11, the upper plate 11a, the lower plate 12b, the left plate 11b and the right plate 12a. In other embodiments, the combination of the front plate 12, the rear plate 11, the upper plate 11a, the lower plate 12b, the left plate 11b and the right plate 12a is adjustable according to the practical requirements, and the present disclosure is not limited thereto. In the embodiment, the rear plate 11 includes a first opening 13, and the front plate 12 includes a second opening 14. Both of the first opening 13 and the second opening 14 are in communication with the accommodation space 15. Notably, the numbers and the types of the first opening 13 and the second opening 14 are adjustable according to the practical requirements, and the present disclosure is not limited thereto. In the embodiment, the power board 20, for example, is a rectangular plate extended along the first direction (X-axis direction) and disposed in parallel to the lower plate 12b, at least partially accommodated in the accommodation space 15, and includes a first side 21, a second side 22, a rear peripheral edge 23, a front peripheral edge 24 and at least two first through-holes 25. It is understandable that the "parallel" described in the present disclosure is not limited to the strict parallel relationship between the two items, and a certain tolerance is allowed in the normal manufacturing process. In that, the two items are also defined as a "parallel" relationship. In the embodiment, the first side 21 and the second side 22 are opposite to each other. The front peripheral edge 24 and the rear peripheral edge 23 are opposite to each other in the first direction (i.e., the X axial direction). Namely, the front peripheral edge 24 and the peripheral side edge 23 are two opposite edges between the first side 21 and the second side 22 of the power board 20. In the embodiment, the rear peripheral edge 23 is disposed adjacent to the rear plate 11 of the housing 10. In the embodiment, the at least two through-holes 25 are passed through the first side 21 and the second side 22 of the power board 20. The output terminal 30, for example, is a gold finger or a metal conductive sheet. The output terminal 30 is disposed in parallel to the lower plate 12b, and passes through the first opening 13 of the rear plate 11 of the housing 10. In the embodiment, the DCDC conversion module 40 is accommodated in the accommodation space 15 and includes a primary circuit 41, a transformer 42 and a secondary circuit 43. The transformer 42 and the secondary circuit 43 are arranged on the power board in sequence. The secondary circuit 43 is arranged on part of the power board 20 where the rear peripheral edge 23 located and electrically connected to the output terminal 30. In the embodiment, the primary circuit 41, the transformer 42 and the secondary circuit 43 of the DCDC conversion module are arranged on the power board 20 in sequence along the first direction (i.e., the X axial direction) and the first direction is perpendicular to the rear plate 11 of the housing 10. That is, the transformer 42 is disposed between the primary circuit 41 and the secondary circuit 43. In other words, the primary circuit 41, the transformer 42, the secondary circuit 43 of the DCDC conversion module 40 and the output terminal 30 are sequentially arranged along the first direction (i.e., the X axial direction). The electrical connection with the power board 20 is implemented by for example but not limited to a line by laying copper. Certainly, the present disclosure is not limited to the primary circuit 41, the transformer 42, the secondary circuit 43 and the output terminal 30 being electrically connected by laying copper in the power board 20. It can be understood that, in some embodiments, it allows that the primary circuit 41 is disposed on another PCB board and then inserted on the power board 20. The present disclosure is not limited thereto. In the embodiment, the transformer 42 includes a transformer winding 421, at least two first magnetic columns 422, a first magnetic cover plate 423 and a second magnetic cover plate 424. At least part of the transformer winding 421 is formed by laying copper in the power board 20. In some embodiments, part of the transformer winding 421 is formed by winding a copper wire around the first magnetic column 422 outside the power board 20. In this embodiment, the transformer winding 421, for example, is arranged around at least one first hole 25. The at least two first magnetic columns 422 correspondingly pass through the at least two first through-holes 25 of the power board 20, respectively. The cross section of the first magnetic column 421, for example, is a rounded rectangle. The first magnetic cover plate 423 and the second magnetic cover plate 424 are disposed correspondingly to the first side 21 and the second side 22 of the power board 20, respectively, and connected to each other through the at least two first magnetic columns 422. That is, the first magnetic cover plate 423 is disposed over the first side 21 of the power board 20, and the second magnetic cover plate 424 is disposed over the second side 22 of the power board 20. In some embodiments, a surface of the second magnetic cover plate 424 is fixed to the second side 22 of the power board 20 by pasting, so that at least two first magnetic columns 422, the first magnetic cover plate 423 and the second magnetic cover plate 424 are fixed relative to the power board 20, and collaboratively form the planar transformer 42 disposed on the power board 20 with the transformer winding 421. In some embodiments, the transformer 42 further includes at least one lateral column, so that a magnetic loop of the transformer 42 is collaboratively formed by the lateral column, the first magnetic columns 422, the first magnetic cover plate 423 and the second magnetic cover plate 424.

In the embodiment, the primary circuit 41 includes at least one primary power component 411 and a bus capacitor 412. The bus capacitor 412 and the at least one primary power component 411 are disposed on the first side 21 of the power board 20, and electrically connected to each other by laying copper in the power board 20. Notably, the number and the connection method of the primary power components 411 are not limited in the present disclosure. In some embodiments, part of primary power components 411 are disposed on the second side 22 of the power board 20. Referring to the first exemplary equivalent circuit diagram of the power supply device 1 shown in FIG. 5, in the embodiment, the primary circuit 41 includes four primary power components 411 (referred to as the elements S1, S2, S3 and S4 in FIG. 5) and the bus capacitor 412 (referred to the element $C_{BUS}$ in FIG. 5). The bridge arm formed by the four primary power components 411 is connected with the bus capacitor 412 in parallel. In the embodiment, the bus capacitor 412 is used to filter an input voltage and provide an instantaneous energy for the DCDC conversion module 40. Since the rated voltage of the bus capacitor 412 is high and a large capacitance is required, the volume of the bus capacitor 412 is large. In the embodiment, the bus capacitor 412 includes a capacitor body 413 and a bus-capacitor circuit board 414. The capacitor body 414 of the bus capacitor 412 is extended along the first direction (i.e., the X axial direction) and disposed on the first magnetic cover plate 423 of the transformer 42. The bus-capacitor circuit board 414 is vertically inserted on the first side 21 of the power board 20 along the Z axial direction, and disposed adjacent to the at least one primary power component 411. An end of the capacitor body 413 is connected to the bus-capacitor circuit board 414.

In the embodiment, when the primary circuit 41, the transformer 42 and the secondary circuit 43 of the DCDC conversion module are disposed on the power board 20 along the first direction in sequence, the bus capacitor 412 of the primary circuit 41 is directly inserted on the power board 20 through the bus-capacitor circuit board 414, so as to omit an interface for the electrical connection with the transformer 42. Furthermore, the capacitor body 413 of the bus capacitor 412 is disposed on the first magnetic cover plate 423 of the planar transformer 42 and extended along the first direction (i.e., the X axial direction) so as to further improve the power density.

In this embodiment, since the DCDC conversion module 40 is directly disposed on the power board 20, and the output terminal 30 is formed by laying copper in part of the power board 20 where the rear peripheral edge 23 is located. The output terminal 30 is allowed to pass through the rear plate 11 of the housing 10 directly, and electrically connected to the external terminals 9. In other words, by directly integrating the planar transformer 42 on the power board 20, the power supply device 1 of the present disclosure can omit the interface between the conventional transformer circuit board and the output terminal 30.

In another embodiment, the output terminal 30 is for example but not limited to a metal conductive sheet, and the metal conductive sheet for example is a rectangular plate. In the embodiment, the rear peripheral edge 23 of the power board 20 is accommodated in the accommodation space And a side of the conductive sheet is fixedly connected to the rear peripheral edge 23 of the power board 20, so that the metal conductive sheet and the power board are extended on the same plane. In that, the metal conductive sheet is allowed to pass through the rear plate 11 of the housing and electrically connected to the external terminal 9.

In the embodiment, the secondary circuit 43 includes at least one secondary power component 431 and an output capacitor 432, and the at least one secondary power component 431 and the output capacitor 432 are arranged on the power board 20 and electrically connected to each other by laying copper in the power board 20. Specifically, the secondary power components 431 are disposed on the first side 21 of the power board 20, or disposed on the second side 22 of the power board 20. Similarly, the output capacitors 432 are disposed on the first side 21 of the power board 20, or disposed the second side 22 of the power board 20. The present disclosure is not limited thereto. In the embodiment, the output capacitor 432 is used to filter an output voltage ripple, and provides an instantaneous energy for a load of the subsequent stage (i.e., the device connected to the external terminal 9). The output capacitor 432 has a low rated voltage and a small size. The output capacitor 432 is connected between the transformer 42 and the output terminal 30, and it helps to reduce the current path flowing through the filter capacitor.

Notably, the number and the connection method of the secondary power components 411 are not limited in the present disclosure. Referring to the first exemplary equivalent circuit diagram of the power supply device 1 shown in FIG. 5, in the embodiment, the secondary circuit 43 includes four secondary power components 431 (referred to as the elements S5, S6, S7 and S8 in FIG. 5) and the output capacitor 432 (referred to the element $C_{OUT}$ in FIG. 5). The bridge arm formed by the four secondary power components 431 connected with the output capacitor 432 in parallel. In the embodiment, the secondary power components 431 and the output capacitor 432 of the secondary circuit 43 are disposed adjacent to the output terminal 30. It helps to reduce the line loss from the DCDC conversion module 40 to the output terminal 30 and reduces the number of interfaces between the components.

In the embodiment, the DCDC conversion module 40 further includes an LLC resonant circuit, the LLC resonant circuit includes a resonant inductor 44 (referred to the element Lr in FIG. 5) arranged between the transformer 42 and the primary circuit 41. In the embodiment, the resonant inductor 44 includes an inductor winding 441, at least one second magnetic column 442, a third magnetic cover plate 443 and a fourth magnetic cover plate 444. In addition, the power board 20 includes at least one second through-hole 26, the at least one second through-hole 26 is passed through the first side 21 and the second side 22 of the power board 20, and the at least two first through-holes 25 are located between the at least one second through-hole 26 and the rear peripheral edge 30. At least part of the inductor winding 441 is arranged around the at least one second hole 26 and formed by laying copper in the power board 20. In some embodiments, part of the inductor winding 441 is formed by winding a copper wire around the second magnetic column 442 outside the power board 20. In the embodiment, the at least one second magnetic column 442 passes through the at least one second through-hole 26 of the power board 20, and the third magnetic cover plate 443 and the fourth magnetic cover plate 444 are disposed correspondingly to the first side 21 and the second side 22 of the power board 20, respectively, and connected to each other through the at least one second magnetic column 422. That is, the third magnetic cover plate 443 is disposed over the first side 21 of the power board 20, and the fourth magnetic cover plate 444 is disposed over the second side 22 of the power board 20. In some embodiments, a surface of the fourth magnetic cover plate 444 is fixed to the second side 22 of the power board 20 by pasting, so that at least one second magnetic column 442, the third magnetic cover plate 443 and the fourth magnetic cover plate 444 are fixed relative to the power board 20, and collaboratively form the resonant inductor 44 disposed on the power board 20 with the inductor winding 441.

In the embodiment, the DCDC conversion module 40 further includes a resonant capacitor 45 (referred to the element Cr in FIG. 5) disposed on the power board 20. In some embodiments, the resonant capacitor 45 is disposed on the first side 21 of the power board 20, or disposed on the second side 22 of the power board 20. The resonant capacitor 45 has a low capacitance value and a small size, and is disposed between the transformer 42 and the primary circuit 41. It helps to reduce the current path flowing through the resonant capacitor 45. Moreover, in the embodiment, the power supply device 1 further comprises an auxiliary power supply unit 47 inserted on the first side 21 of the power board 20 along the second direction (i.e., the Z axial direction), electrically connected to the DCDC conversion module 40, and arranged adjacent to one side of the transformer 42. Without affecting the stacking of the capacitor body 413 of the bus capacitor 412 and the first magnetic cover plate 423 of the transformer 42 in the Z axial direction, the auxiliary power supply unit 47 is used to supply the power to the components in the primary circuit 41 and the secondary circuit 43. In the embodiment, the power supply device 1 further comprises a control board 46 inserted on the first side of the power board along the second direction (i.e., the Z axial direction), electrically connected to the power board 20, and arranged adjacent to one side of the transformer 42. Without affecting the stacking of the capacitor body 413 of the bus capacitor 412 and the first magnetic cover plate 423 of the transformer 42 in the Z axial direction, the control board 46 is used to control the turn-on and turn-off of the power components in the primary circuit 41 and the secondary circuit 43. Thus, a stable output of the power supply device 1 is achieved.

In the embodiment, the power supply device 1 further includes a fan 50 accommodated in the accommodation space 15 and disposed adjacent to the front plate 12 of the housing. In the embodiment, the fan is controlled to form an airflow channel, and the airflow channel passes through the DCDC conversion module 40 from the second opening 14 and is extended along the first direction (i.e., the X axial direction) to the first opening 13. In the embodiment, when the DCDC conversion module 40 is directly disposed on the power board 20, the power supply device 1 has the output terminal 30 passing through the rear plate 11 of the housing 10 and further has the fan 50 disposed adjacent to the front plate 12 of the housing 10. In that, an airflow channel is formed between the two opposite plates to effectively dissipate the heat generated by the transformer 42, the power components and other heat-generating components in the DCDC conversion module 40. In the embodiment, the power supply device 1 further includes an input board 60 accommodated in the accommodation space 15 of the housing, electrically connected to the power board 20, and disposed between the DCDC conversion module 40 and the front plate 12 of the housing 10. In the embodiment, a voltage conversion module 61 and an EMI module 62 are disposed on the input board 60, and electrically connected to the power board 20 through the input board 60. In an embodiment, the voltage conversion module 61 for example is a PFC module, which is used to convert an input alternating current into a direct current. In another embodiment, the voltage conversion module 61 for example is a Booster module inserted on the input board 60 and electrically connected to the power board 20 through the input board 60 for converting an input lower DC voltage into a higher DC voltage. In the embodiment, the EMI module 62 is used to enhance the electromagnetic compatibility of the power supply device 1. In the embodiment, the voltage conversion module 61 is disposed adjacent to the fan 50, so that the voltage conversion module 61 is spatially corresponding to the airflow channel. Certainly, in other embodiments, the fan 50 is omitted. The present disclosure is not limited thereto. In the embodiment, the power supply device 1 further includes an input-end component 63. The input-end component 63 penetrates through the front plate 12 through the second opening 14. The input-end component 63 is directly electrically connected to the power board 20 or electrically connected to the power board 20 through an input board 60. Relative to the rear peripheral edge 23 disposed adjacent to the rear plate 11 of the housing 10, the front peripheral edge 24 of the power board 20 is extended to connect to the input board 60 toward the front plate 12, so that the voltage conversion module 61, the EMI module 62 and the input-end component 63 are integrated within the accommodation space 15 of the housing. Thus, the power density of the power supply device 1 is improved effectively and the competitiveness of the product is enhanced. Certainly, the present disclosure is not limited thereto.

Figure 7:
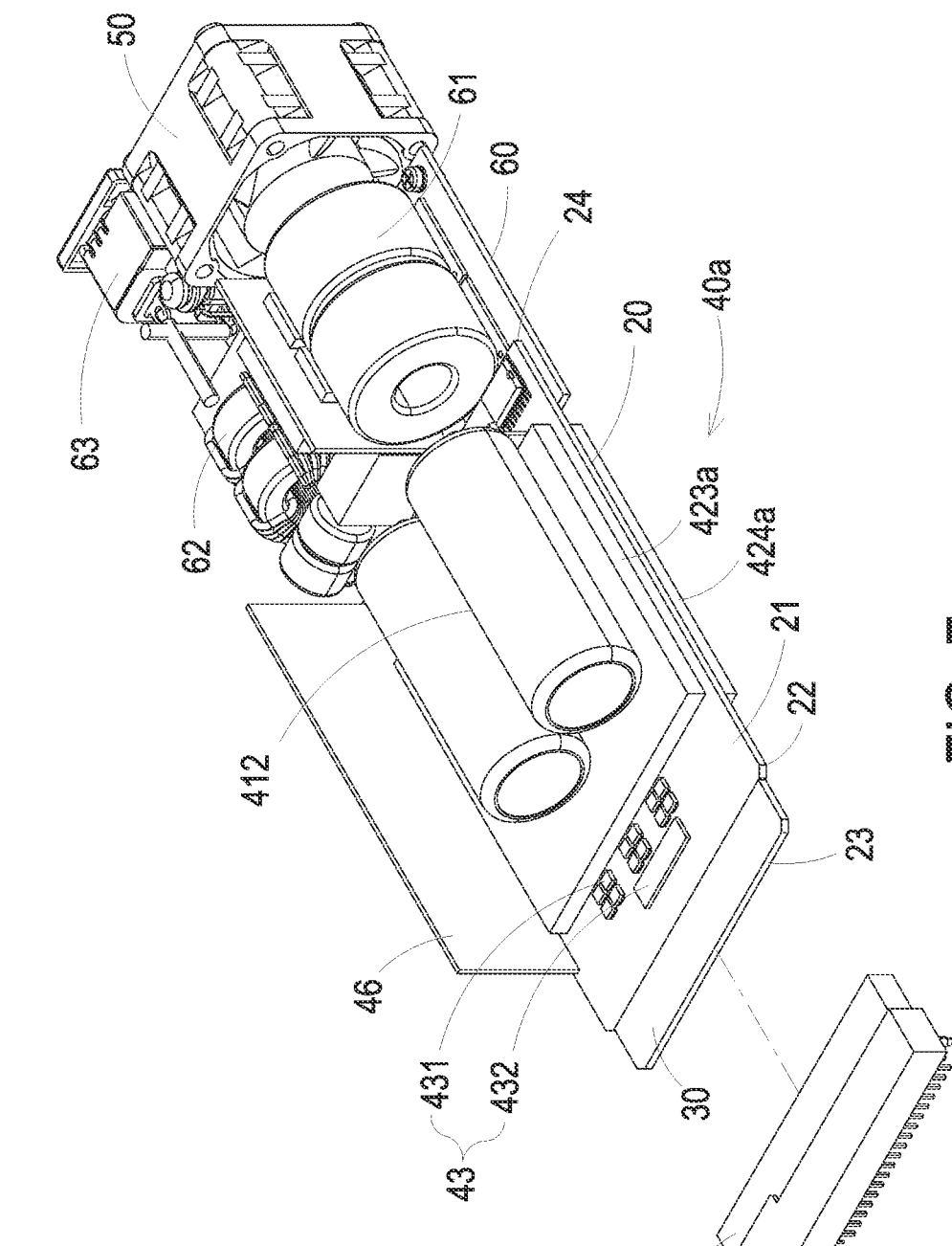
FIG. 7 is a schematic structural view illustrating internal components of a power supply device according to a second embodiment of the present disclosure.
Figure 8:
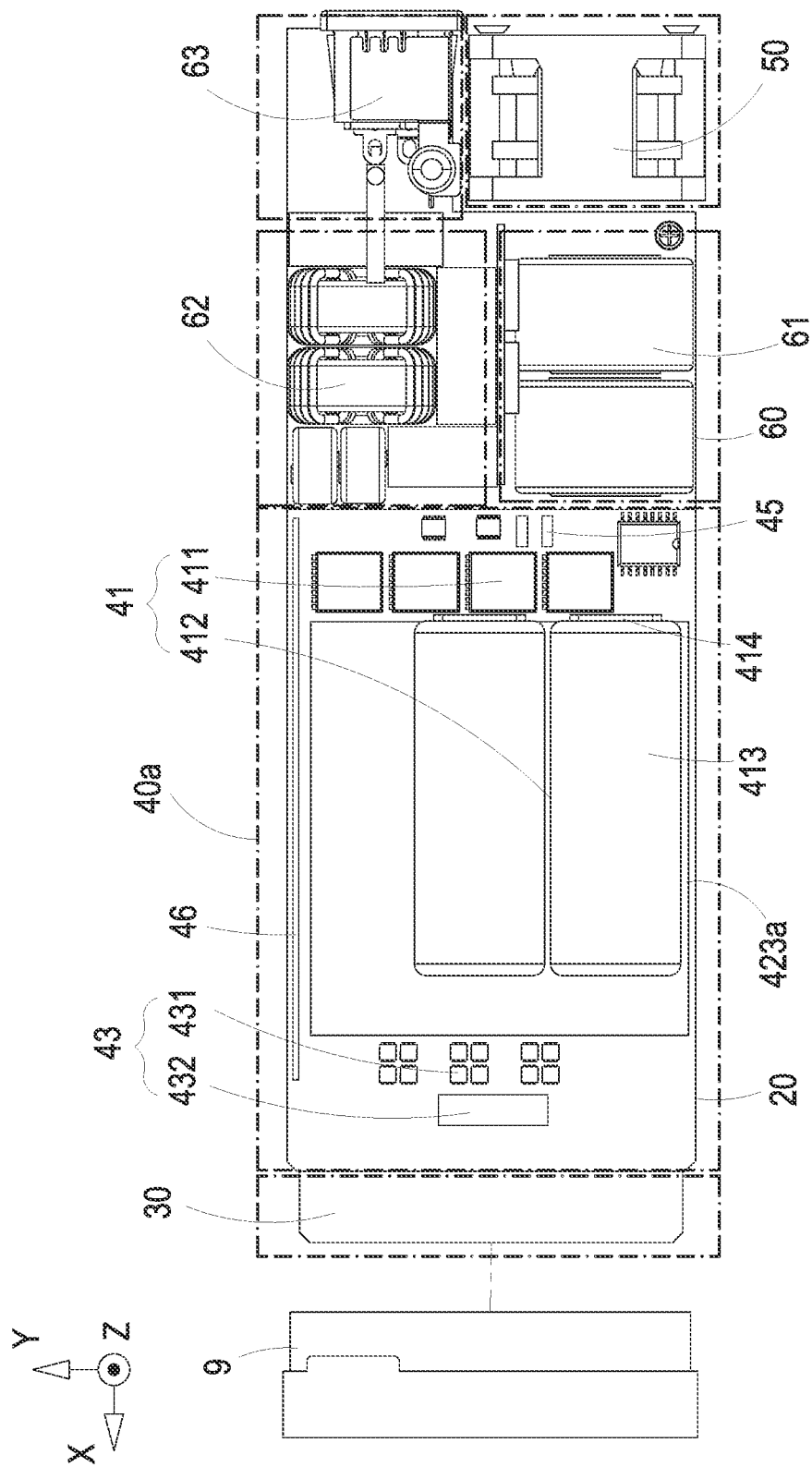
FIG. 8 is a top view of FIG. 7.
Figure 9:
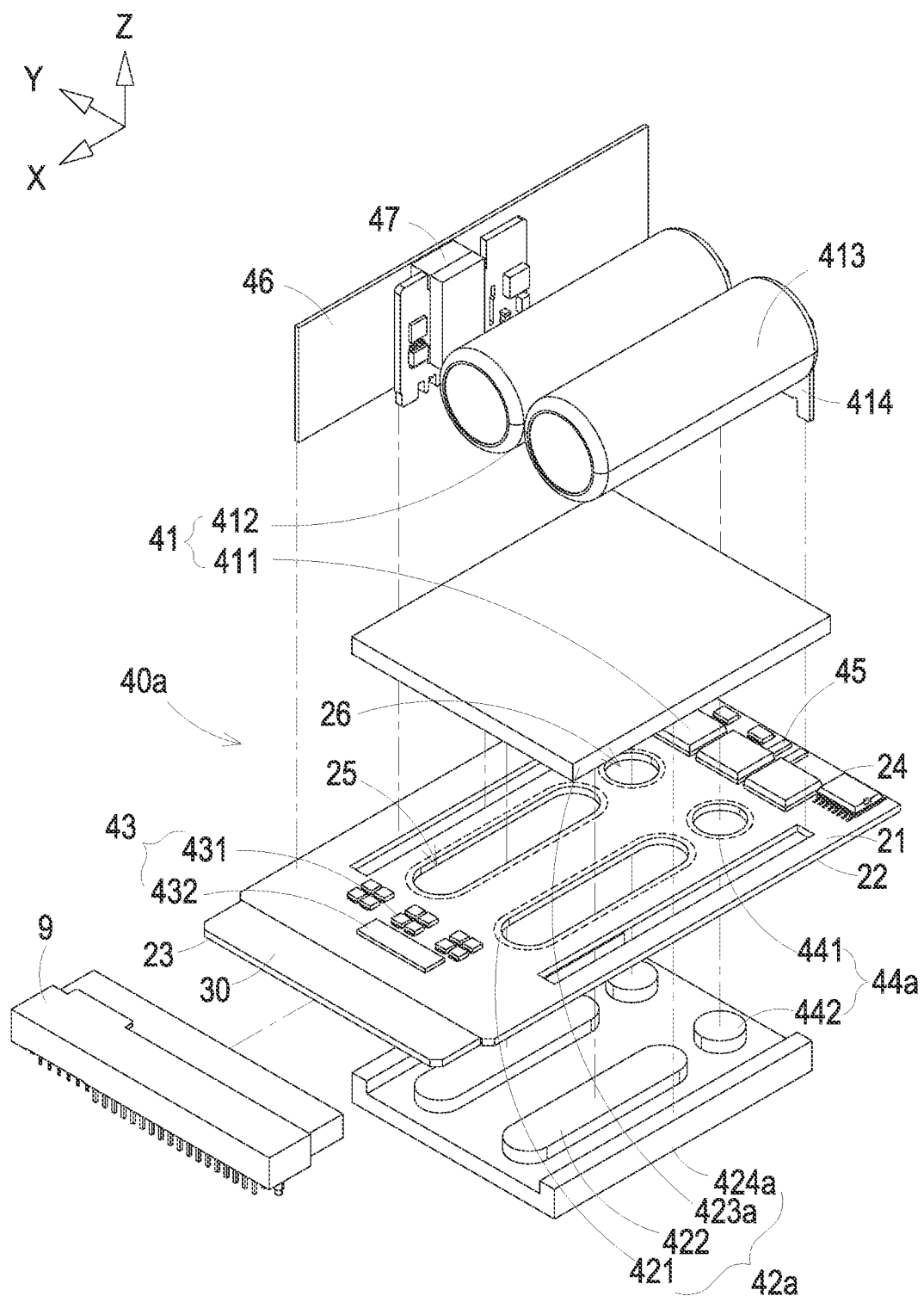
FIG. 9 is an exploded view illustrating the internal components of the power supply device according to the second embodiment of the present disclosure.

FIG. 7 is a schematic structural view illustrating internal components of a power supply device according to a second embodiment of the present disclosure. FIG. 8 is a top view of FIG. 7. FIG. 9 is an exploded view illustrating the internal components of the power supply device according to the second embodiment of the present disclosure. In the embodiment, the structures, elements and functions of the power supply device 1a are similar to those of the power supply device 1 of FIG. 1 to FIG. 6, and are not redundantly described herein. In the embodiment, the power supply device 1a omits the auxiliary power supply unit 47 of the power supply device 1, and it allows expending the size of the first magnetic cover plate 423a and the second magnetic cover plate 424a of the transformer 42a of the DCDC conversion module 40a in the XY plane, that is, in the horizontal direction of the power board 20, so as to further increase the power density. Certainly, the present disclosure is not limited thereto. On the other hand, in the embodiment, the first magnetic cover plate 423a and the second magnetic cover plate 424a are extended horizontally to replace the third magnetic cover plate 443 and the fourth magnetic cover plate 444 of the power supply device 1. Namely, the third magnetic cover plate 443 and the first magnetic cover plate 423 are integrated to form an integrated structure; and the fourth magnetic cover plate 444 and the second magnetic cover plate 424 are integrated to form an integrated structure. Certainly, in some embodiments, the combination of the third magnetic cover plate 443 and the first magnetic cover plate 423 or the combination of the fourth magnetic cover plate 444 and the second magnetic cover plate 424 is selected to form the integrated structure merely, and the present disclosure is not limited thereto. In the embodiment, the at least one second magnetic column 442 of the resonant inductor 44a is connected with the first magnetic cover plate 423a and the second magnetic cover plate 424a by passing through the at least one second through-hole 26 of the power board 20, so as to collaboratively form the resonant inductor 44 on the power board 20 with the inductor winding 441a. In other words, when the sizes of the first magnetic cover plate 423a and the second magnetic cover plate 424a are enlarged, it allows combining the first magnetic cover plate 423a and the second magnetic cover plate 424a with other magnetic cores such as the resonant inductor 44a to form an integrated structure. Thus, the manufacturing process and the assembling process are simplified, and the cost is reduced. Furthermore, the purposes of reducing the line loss and reducing the number of interfaces are achieved at the same time. Certainly, the present disclosure is not limited thereto.

Figure 10:
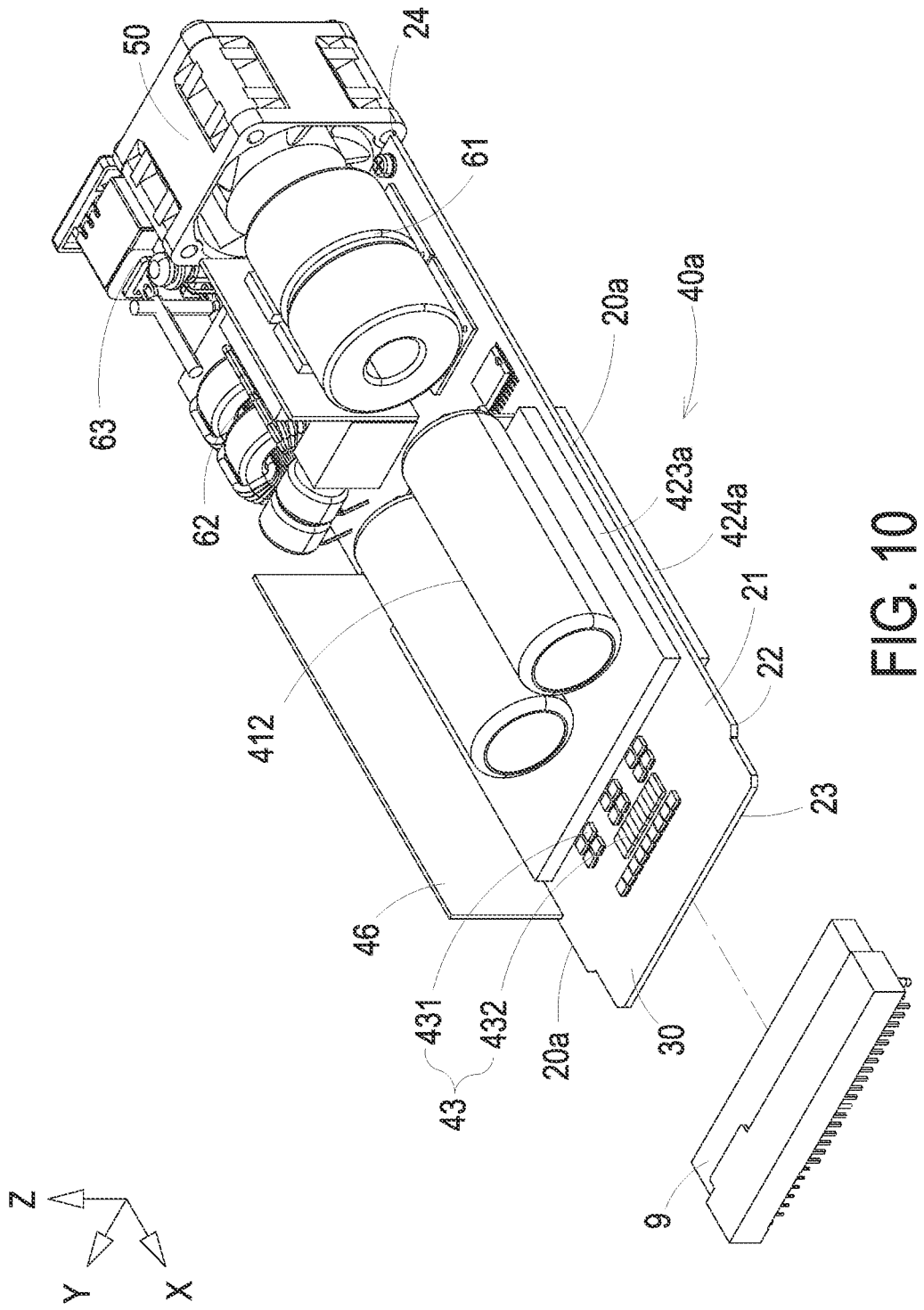
FIG. 10 is a schematic structural view illustrating internal components of a power supply device according to a third embodiment of the present disclosure.
Figure 11:
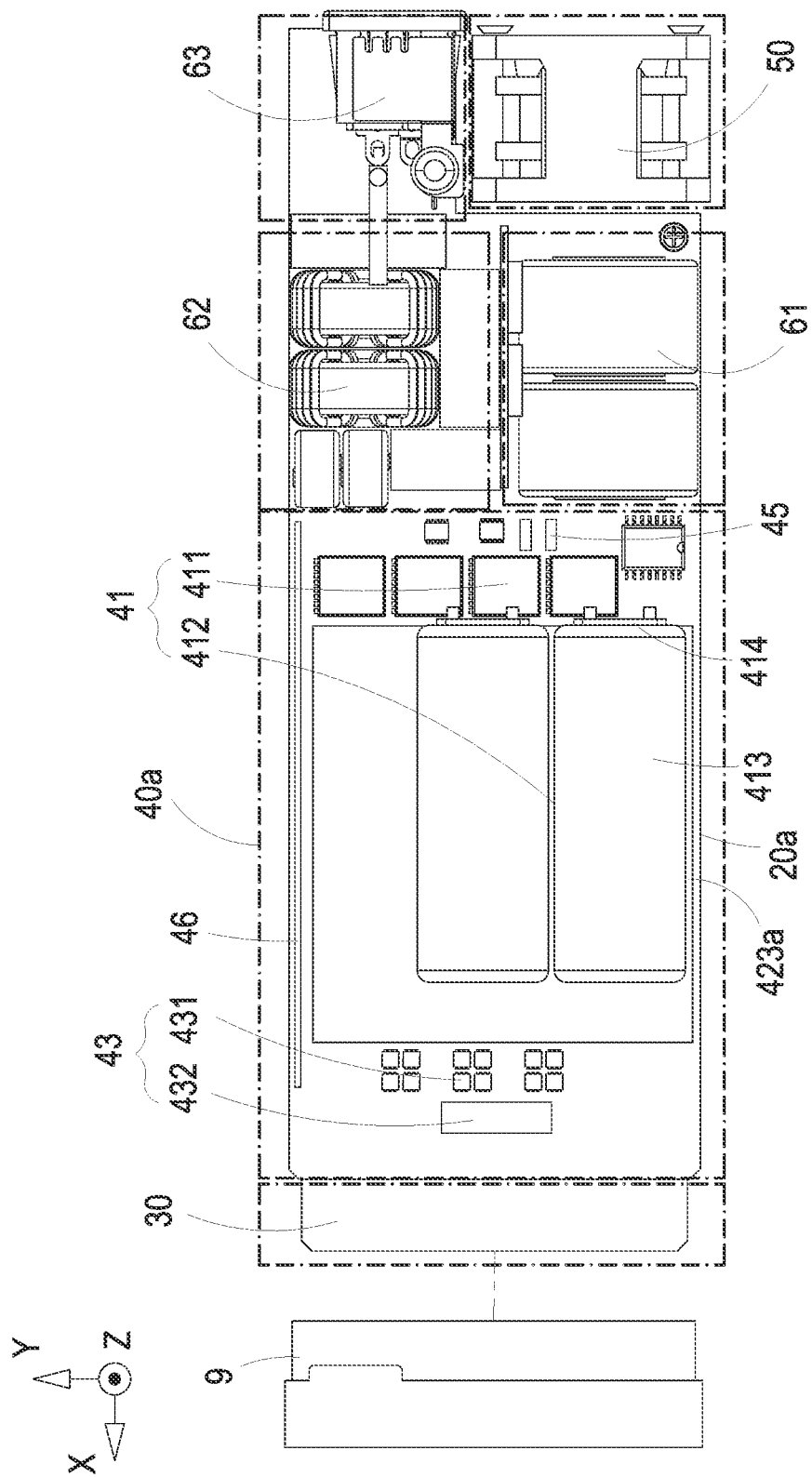
FIG. 11 is a top view of FIG. 10.
Figure 12:
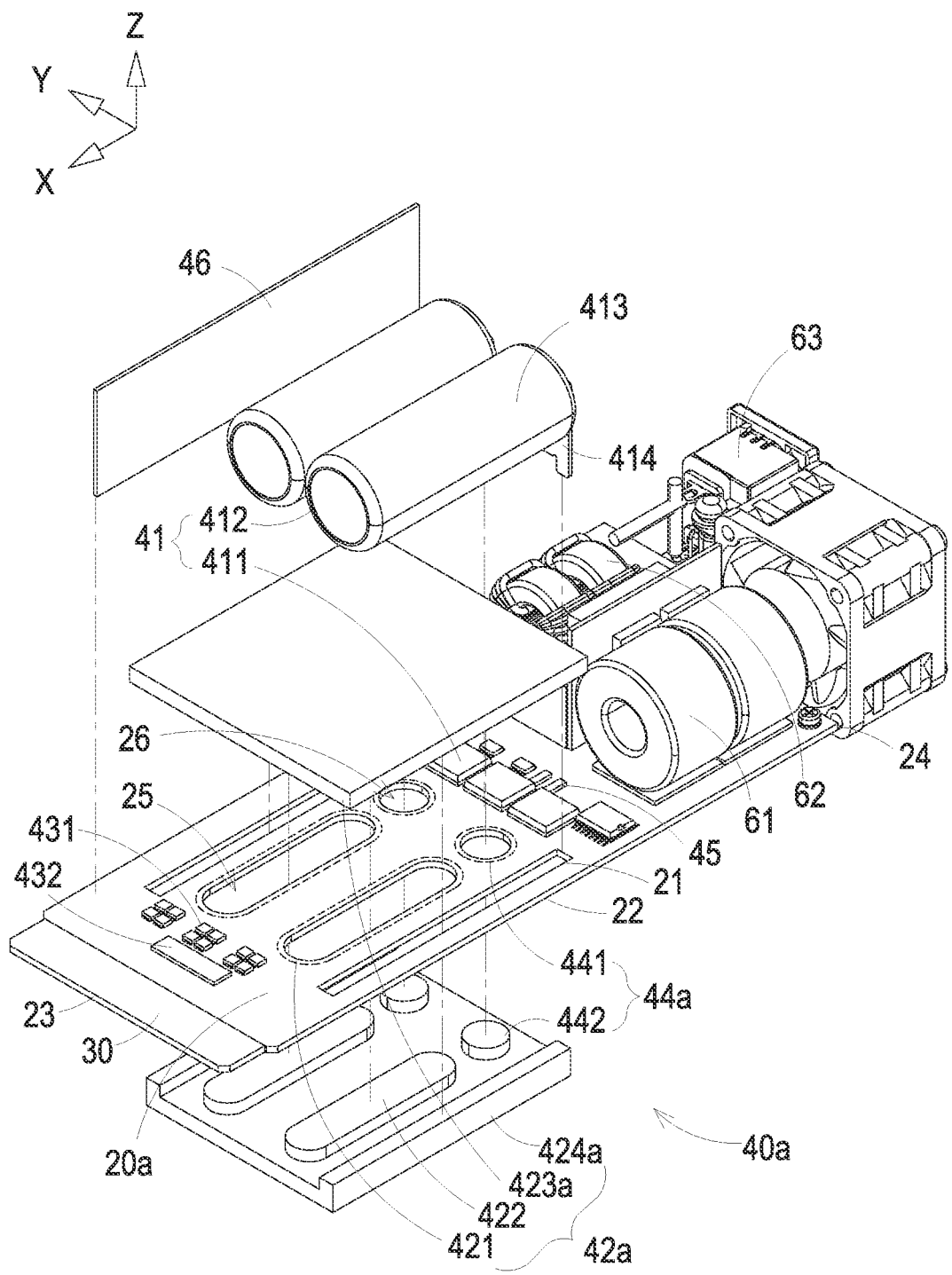
FIG. 12 is an exploded view illustrating the internal components of the power supply device according to the third embodiment of the present disclosure.

FIG. 10 is a schematic structural view illustrating internal components of a power supply device according to a third embodiment of the present disclosure. FIG. 11 is a top view of FIG. 10. FIG. 12 is an exploded view illustrating the internal components of the power supply device according to the third embodiment of the present disclosure. In the embodiment, the structures, elements and functions of the power supply device 1b are similar to those of the power supply device 1a of FIG. 7 to FIG. 9, and are not redundantly described herein. In the embodiment, the power board 20a of the power supply device 1b is further extended from the rear plate 11 of the housing 10 toward the front panel 12. In that, the front peripheral edge 24 of the power board 20a is closer to the front plate 12. In the embodiment, the fan 50 and the input-end component 62 are disposed between the front peripheral edge 24 of the power board 20a and the front plate 12 of the housing 10. In the embodiment, the voltage conversion module 61 and the EMI module 62 are directly disposed on the power board 20a, and electrically connected to the DCDC conversion module 40a through laying copper wires in the power board 20a. Compared with the foregoing embodiment, the power supply device 1b further omits the interface between the power board 20 and the input board 60 in the power supply device 1a. In addition, the DCDC conversion module 40a, the voltage conversion module 61 and the EMI module 62 are disposed on the power board 20a and the electrical connections thereof are implemented by laying copper wires. It helps to simplify the manufacturing process and the assembly process, reduce the cost, and achieve the purpose of reducing the line loss and reducing the number of interfaces at the same time.

Figure 13:
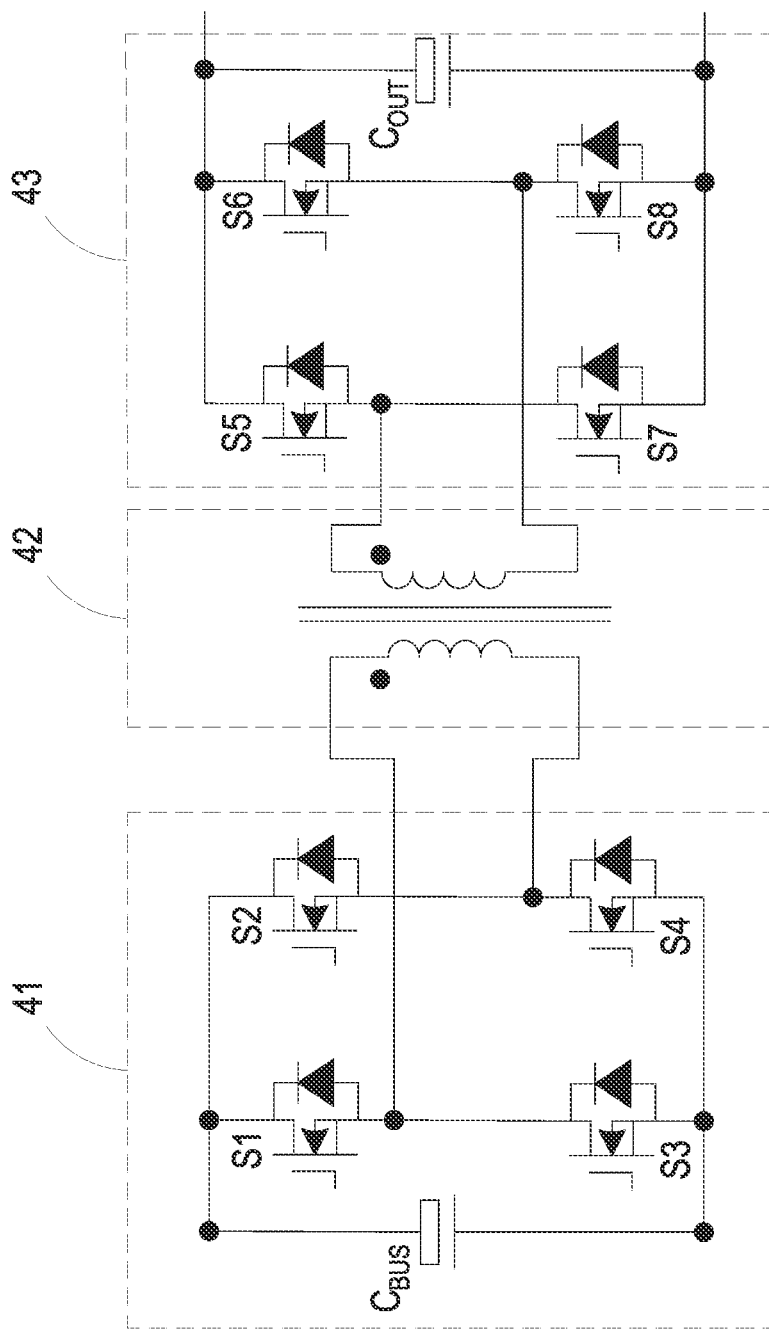
FIG. 13 schematically shows a second exemplary equivalent circuit diagram of the power supply device of the present disclosure.
Figure 14:
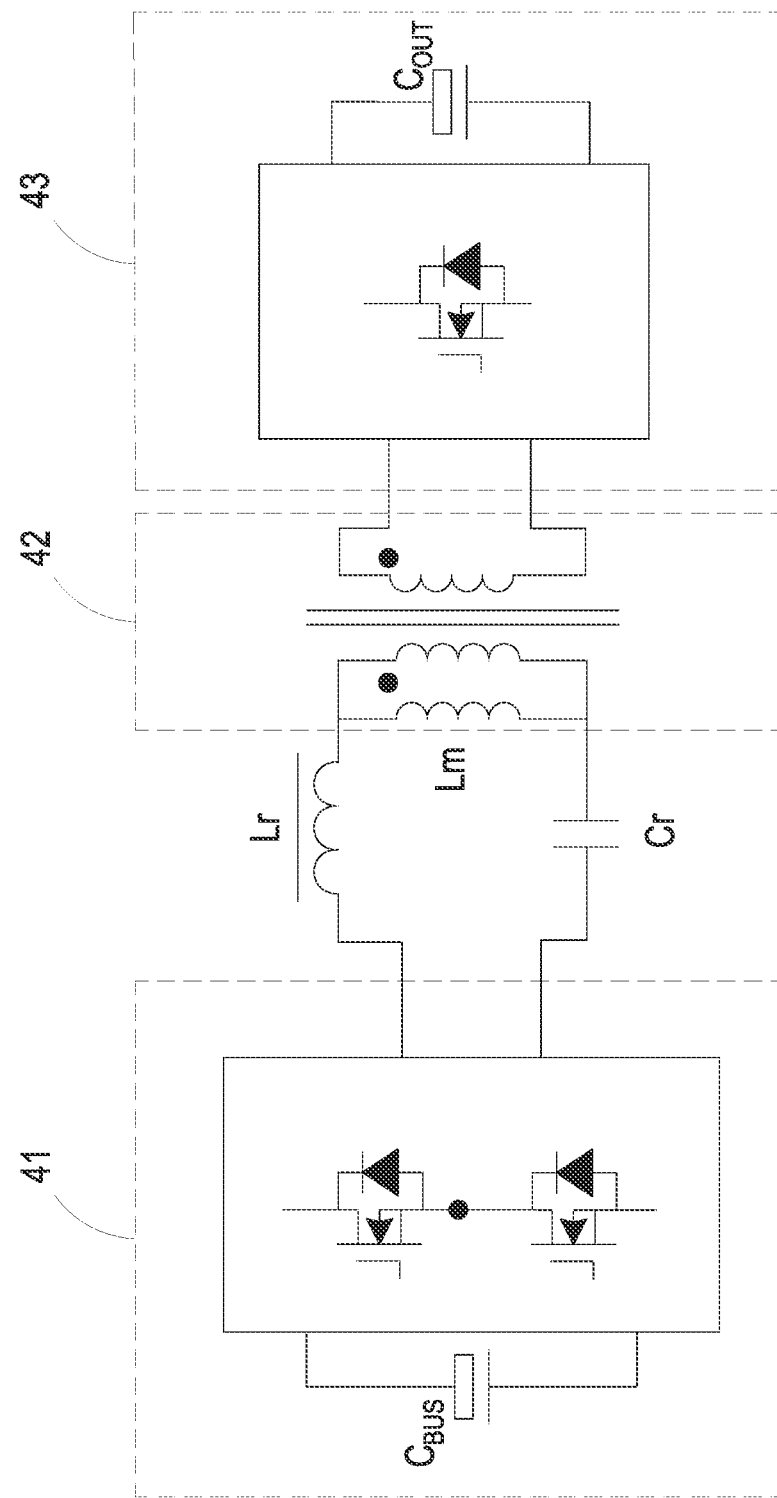
FIG. 14 schematically shows a third exemplary equivalent circuit diagram of the power supply device of the present disclosure.
Figure 15:
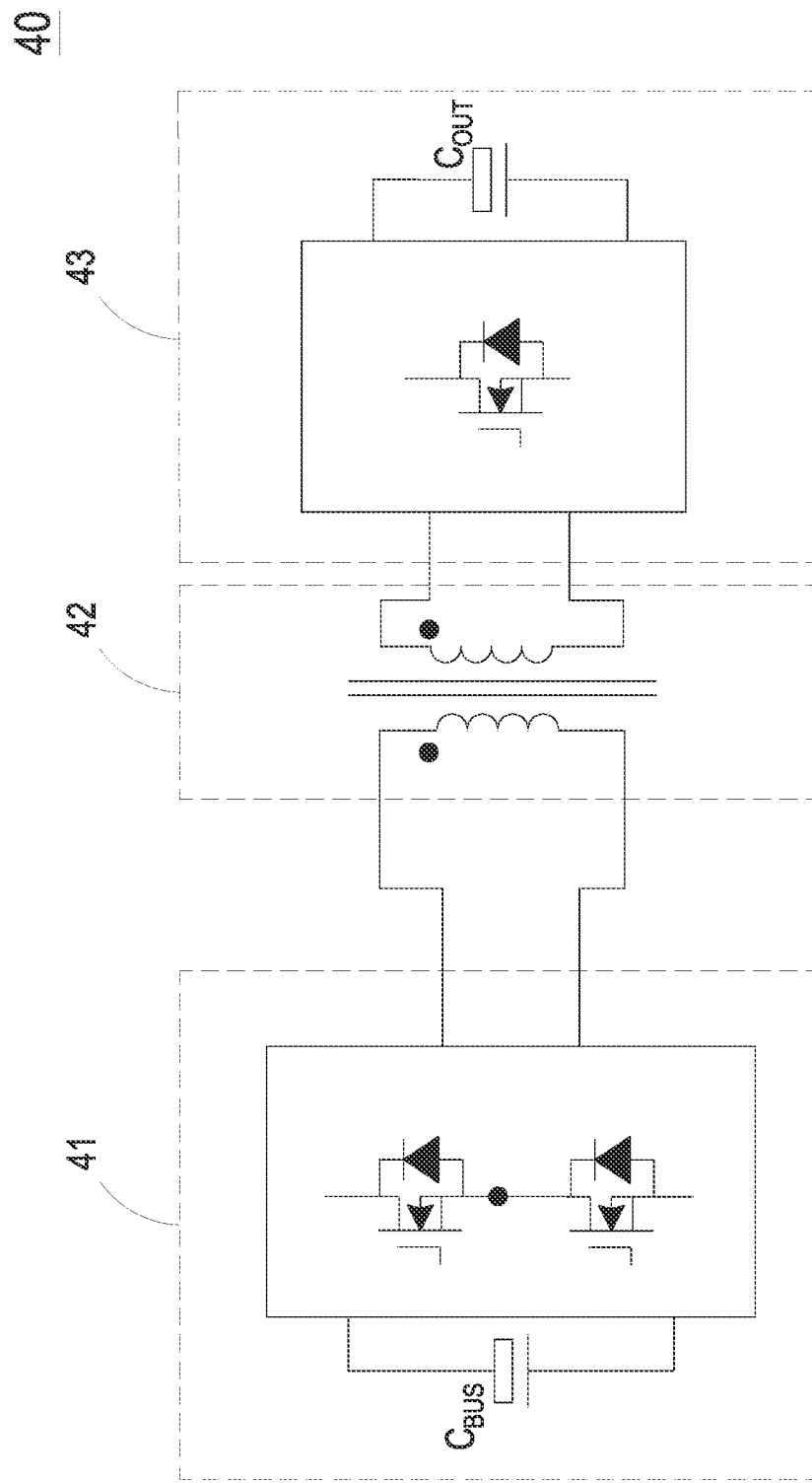
FIG. 15 schematically shows a fourth exemplary equivalent circuit diagram of the power supply device of the present disclosure.

Notably, the primary circuit 41, the transformer 42 and the secondary circuit 43 of the DCDC conversion modules 40, 40a in the foregoing embodiments are adjustable according to the practical requirements. FIG. 5 is only a first exemplary equivalent circuit diagram, and the numbers and the arrangements of the internal components of the primary circuit 41, the transformer 42 and the secondary circuit 43 are not limited thereto. FIG. 13 schematically shows a second exemplary equivalent circuit diagram of the power supply device of the present disclosure. Please refer to FIGS. 1 to 4 and 13. Different from the first exemplary equivalent circuit diagram in FIG. 5, in the embodiment, the DCDC conversion module 40 further omits the resonant inductor 44 and the resonant capacitor 45. In addition, FIG. 14 schematically shows a third exemplary equivalent circuit diagram of the power supply device of the present disclosure. In the embodiment, the primary circuit 41 and the secondary circuit 43 include different numbers of primary power components 411 and the secondary power components 431, respectively. For example, two primary power components 411 and one secondary power component 431 are used. Certainly, the numbers of the primary power components 411 and the secondary power components 431 disposed on the power board 20 are adjustable according to the practical requirements, and the present disclosure is not limited thereto. Furthermore, FIG. 15 schematically shows a fourth exemplary equivalent circuit diagram of the power supply device of the present disclosure. In the embodiment, the primary circuit 41, the transformer 42 and the secondary circuit 43 of the DCDC conversion module 40 are configured to form a Buck circuit. Certainly, the present disclosure is not limited thereto and not redundantly described herein.

Figure 16:
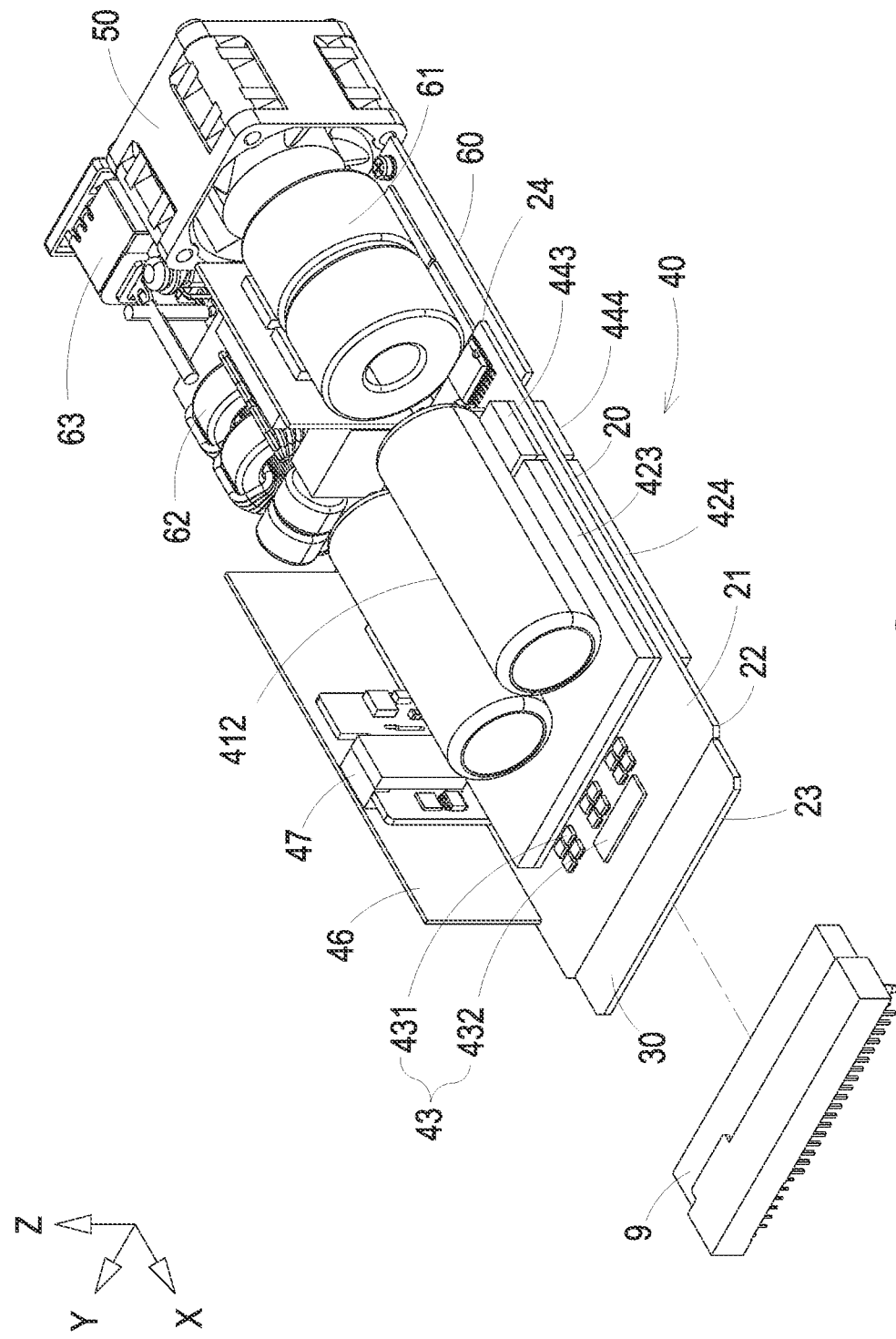
FIG. 16 is a schematic structural view illustrating internal components of a power supply device according to a fourth embodiment of the present disclosure.
Figure 17:
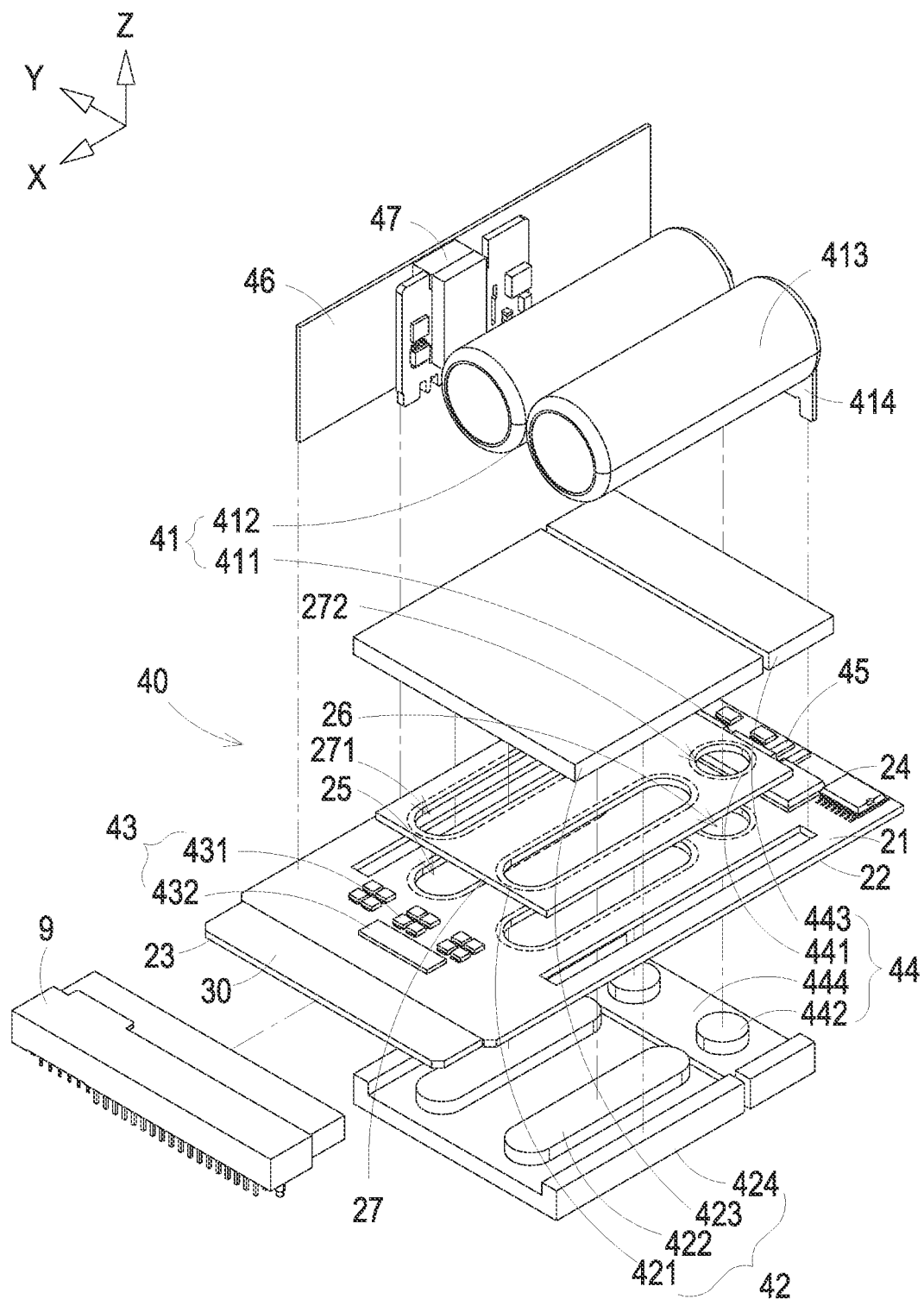
FIG. 17 is an exploded view illustrating the internal components of the power supply device according to the fourth embodiment of the present disclosure.

FIG. 16 is a schematic structural view illustrating internal components of a power supply device according to a fourth embodiment of the present disclosure. FIG. 17 is an exploded view illustrating the internal components of the power supply device according to the fourth embodiment of the present disclosure. In the embodiment, the structures, elements and functions of the power supply device 1c are similar to those of the power supply device 1 of FIG. 1 to FIG. 6, and are not redundantly described herein. In the embodiment, the power supply device 1c further includes an additional circuit board 27 disposed between the first magnetic cover plate 423 of the transformer 42 and the first side 21 of the power board 20. The additional circuit board 27 includes at least two third through-holes 271. The at least two third through-holes 271 are passed through the additional circuit board 27, and spatially corresponding to the at least two first through-holes 25 of the power board. In the embodiment, the at least two first magnetic columns 422 correspondingly pass through the at least two third through-holes 271 of the additional circuit board 27, and the at least two first through-holes 25 of the power board 20. In addition, part of the transformer winding 421 is disposed around the at least one third through-hole 271 and formed by laying copper in the additional circuit board 27. In that, the part of the transformer winding 421 disposed in the additional circuit board 27 and the part of the transformer winding 421 disposed in the power board 20 are combined to form the transformer winding 421 in this embodiment. In other embodiments, the additional circuit board 27 is further disposed between the first side 21 of the power board 20 and the third magnetic cover plate 443. Moreover, the additional circuit board 27 includes at least two third through-holes 271 and at least one fourth through-hole 272. The at least two third through-holes 271 and the at least one fourth through-hole 272 are passed through the additional circuit board 27, and spatially corresponding to the at least two first through-holes 25 and the second through-hole 26 of the power board 20, respectively. The at least two first magnetic columns 422 correspondingly pass through the at least two third through-holes 271 of the additional circuit board 27, and the at least two first through-holes 25 of the power board 20. The at least one second magnetic columns 442 correspondingly passes through the at least one fourth through-hole 272 of the additional circuit board 27, and the at least one second through-hole 26 of the power board 20. Part of the transformer winding 421 is disposed around the at least one third through-hole 271 and part of the inductor winding 441 is disposed around the at least one fourth through-hole 272. The part of the transformer winding 421 and the part of the inductor winding 441 are formed by laying copper in the additional circuit board 27. The part of the transformer winding 421 disposed in the additional circuit board 27 and the part of the transformer winding 421 disposed in the power board 20 are combined to form the transformer winding 421 in this embodiment. The part of the inductor winding 441 disposed in the additional circuit board 27 and the part of the inductor winding 441 disposed in the power board 20 are combined to form the transformer winding 441 in this embodiment. Thereby, the transformer winding 421 of the transformer 42 and the inductor winding 441 of the resonant inductor 44 are implemented in multiple varied applications. In other embodiments, the additional circuit board 27 is disposed between the second magnetic cover plate 424 of the transformer 42 and the second side 22 of the power board 20, and further disposed between the fourth magnetic cover plate 444 of the resonant inductor 44 and the second side 22 of the power board 20. The present disclosure is not limited thereto.

In summary, the present disclosure provides a power supply device for optimizing the arrangement of a planar transformer, increasing the power rating of the transformer, and reducing the line loss at the same time. When a DCDC conversion module is directly installed on a power board, an output terminal is directly formed by for example laying copper in part of the power board where a peripheral edge is located, or an output terminal is fixedly connected to the peripheral edge of the power board through a metal conductive sheet, so that the output terminal is allowed to pass through the housing and directly connect to an external terminal. Moreover, with the planar transformer directly integrated into the power board, it allows to omit the interface of connecting the planar-transformer board to the output terminal. On the other hand, when the transformer and the secondary circuit of the DCDC conversion module are sequentially arranged on the power board, it allows inserting the bus capacitor of the primary circuit into the power board through a bus-capacitor circuit board directly, thereby reducing the interface electrically connected to the transformer. Furthermore, it allows to stack the capacitor body of the bus capacitor over a first magnetic cover plate of the planar transformer, for example, along a first direction. Moreover, it also allows inserting other adjacent control boards and auxiliary power supply units on the power board directly to achieve the electrical connections, so as to further increase the power density. By disposing the DCDC conversion module and the output terminal in a planar arrangement on the power board, the current flow path is decreased, the number of interfaces between the components is reduced, and the size limit of the transformer in the DCDC conversion module relative to the height of the housing is eased, so as to increase the power rating of the transformer. When the DCDC conversion module is directly disposed on the power board, the planarization of the transformer is helpful of expanding the horizontal size of the magnetic cover plate along the extension direction of the power board, so as to improve the power density. When the size of the magnetic cover plate of the transformer is enlarged, it is allowed to combine with for example a magnetic cover plate of a resonant inductor to form an integrated structure. It has advantages of simplifying the manufacturing and assembly process, reducing the costs, and can achieve the purpose of reducing line loss and reducing the number of interfaces. On the other hand, when the DCDC conversion module is directly installed on the power board, the output terminal of the power supply device is allowed to pass through the rear plate of the housing, and it allows combing a fan adjacent to the front panel of the housing to form an airflow channel in communication between the two opposite plates. It facilitates to dissipate the heat generated from the transformer, the power components and the heat-generating components in the DCDC conversion module. Furthermore, as opposed to the output terminal of the power supply device passing through the rear plate, the power board is extended toward the front plate or combined with an input board to integrate a voltage conversion module, an EMI module or input terminal components in the accommodation space of the housing, so as to improve the power density effectively and enhance the product competitiveness.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power supply device, comprising:
   a housing comprising an accommodation space, a rear plate and a lower plate, wherein the rear plate comprises a first opening, and the first opening is in communication with the accommodation space;
   a power board disposed in parallel to the lower plate, at least partially accommodating in the accommodation space, and comprising at least two first through-holes, a peripheral edge, a first side and a second side, wherein the first side and the second side are opposite to each other, the at least two first through-holes are passed through the first side and the second side of the power board, and the peripheral edge is disposed adjacent to the rear plate;
   an output terminal disposed in parallel to the lower plate, and passing through the first opening of the rear plate; and
   a DCDC conversion module accommodating in the accommodation space and comprising a primary circuit, a transformer and a secondary circuit, wherein the transformer and the secondary circuit are arranged on the power board in sequence, the secondary circuit is arranged on part of the power board existing the peripheral edge and electrically connected to the output terminal, and the transformer comprises a transformer winding, at least two first magnetic columns, a first magnetic cover plate and a second magnetic cover plate, wherein at least part of the transformer winding is formed by laying copper in the power board, the at least two first magnetic columns pass through the at least two first through-holes of the power board, respectively, and the first magnetic cover plate and the second magnetic cover plate are disposed correspondingly to the first side and the second side of the power board, respectively, and connected to each other through the at least two first magnetic columns;

wherein the primary circuit comprises a bus capacitor, and a capacitor body of the bus capacitor is extended along a first direction and disposed on the first magnetic cover plate of the transformer, and the first direction is perpendicular to the rear plate.

2. The power supply device according to claim 1, wherein the primary circuit further comprises at least one primary power component, wherein the at least one primary power component is disposed on the first side of the power board, and the primary circuit, the transformer and the secondary circuit are arranged along the first direction in sequence.

3. The power supply device according to claim 2, wherein the bus capacitor further comprises a bus-capacitor circuit board, and the bus-capacitor circuit board is inserted on the first side of the power board and disposed adjacent to the at least one primary power component, wherein an electrical connection between the bus-capacitor circuit and the at least one primary power component is implemented by laying copper pour in the power board, and an end of the capacitor body is connected to the bus-capacitor circuit board.

4. The power supply device according to claim 1, wherein an electrical connection between the output terminal and the DCDC conversion module is implemented by laying copper in the power board.

5. The power supply device according to claim 1, wherein the output terminal is a gold finger formed by laying copper in a portion of the power board existing the peripheral edge, and the gold finger is configured to connect to an external terminal.

6. The power supply device according to claim 1, wherein the output terminal is a metal conductive sheet, the peripheral edge of the power board is accommodating in the accommodation space, a side of the metal conductive sheet is fixedly connected to the peripheral edge of the power board, and the metal conductive sheet is configured to connect to an external terminal.

7. The power supply device according to claim 1, wherein a surface of the second magnetic cover plate is fixed to the second side of the power board by pasting.

8. The power supply device according to claim 1, wherein the secondary circuit comprises at least one secondary power component and an output capacitor, and the at least one secondary power component and the output capacitor are arranged on the power board and electrically connected to each other by laying copper in the power board.

9. The power supply device according to claim 1, wherein the DCDC conversion module further comprises an LLC resonant circuit, the LLC resonant circuit comprises a resonant inductor and a resonant capacitor, the resonant capacitor is disposed on the power board, and the resonant inductor and the resonant capacitor are arranged between the transformer and the primary circuit.

10. The power supply device according to claim 9, wherein the resonant inductor comprises an inductor winding, at least one second magnetic column, a third magnetic cover plate and a fourth magnetic cover plate, the power board comprises at least one second through-hole, the at least one second through-hole is passed through the first side and the second side of the power board, and located between the at least two first through-holes and the peripheral edge, wherein at least part of the inductor winding is formed by laying copper in the power board, the at least one second magnetic column passes through the at least one second through-hole of the power board, and the third magnetic cover plate and the fourth magnetic cover plate are disposed correspondingly to the first side and the second side of the power board, respectively, and connected to each other through the at least one second magnetic column.

11. The power supply device according to claim 10, further comprising an additional circuit board disposed between the power board and the first and the third magnetic cover plate, or disposed between the power board and the second and the fourth magnetic cover plate, wherein the additional circuit board comprises at least two third through-holes and at least one fourth through-hole, the at least two third through-holes and the at least one fourth through-hole are passed through the additional circuit board, the at least two first magnetic columns correspondingly pass through the at least two third through-holes of the additional circuit board, the at least one second magnetic column correspondingly passes through the at least one fourth through-hole of the additional circuit board, and part of the transformer winding and part of the inductor winding are formed by laying copper in the additional circuit board.

12. The power supply device according to claim 10, wherein the third magnetic cover plate and the first magnetic cover plate are integrated into an integral structure, and/or the fourth magnetic cover plate and the second magnetic cover plate are integrated into an integral structure, and/or the fourth magnetic cover plate is fixed to the second side of the power board by pasting.

13. The power supply device according to claim 1, further comprising an additional circuit board disposed between the power board and the first magnetic cover plate, or disposed between the power board and the second magnetic cover plate, wherein the additional circuit board comprises at least two third through-holes, the at least two third through-holes are passed through the additional circuit board, the at least two first magnetic columns correspondingly pass through the at least two third through-holes of the additional circuit board, and part of the transformer winding is formed by laying copper in the additional circuit board.

14. The power supply device according to claim 1, wherein the power supply device further comprises an auxiliary power supply unit inserted on the first side of the power board along a second direction, electrically connected to the DCDC conversion module, and arranged adjacent to the transformer, and/or the power supply device further comprises a control board inserted on the first side of the power board along the second direction, electrically connected to the power board, and arranged adjacent to the transformer, wherein the second direction is perpendicular to the power board.

15. The power supply device according to claim 1, wherein the housing further comprises a front plate, the front plate is disposed opposite to the rear plate and comprises a second opening, and the second opening is in communication with the accommodation space.

16. The power supply device according to claim 15, further comprising a fan accommodated in the accommodation space and disposed adjacent to the front plate, wherein the fan is controlled to form an airflow channel, and the airflow channel passes through the DCDC conversion module from the second opening and is extended to the first opening.

17. The power supply device according to claim 16, further comprising a voltage conversion module accommodated in the accommodation space, located between the DCDC conversion module and the front plate, disposed adjacent to the fan, and spatially corresponding to the airflow channel, wherein the voltage conversion module is a PFC module or a Boost module.

18. The power supply device according to claim 17, wherein the voltage conversion module is directly inserted on the first side of the power board and electrically connected to the power board, or the voltage conversion module is inserted on an input board, and connected to the power board through the input board to achieve an electrical connection.

19. The power supply device according to claim 15, further comprising an EMI module accommodated in the accommodation space and located between the DCDC conversion module and the front plate.

20. The power supply device according to claim 19, wherein the EMI module is directly inserted on the first side of the power board and electrically connected to the power board, or the EMI module is disposed on an input board, and connected to the power board through the input board to achieve an electrical connection.

21. The power supply device according to claim 15, further comprising an input-end component, wherein the input-end component penetrates through the front plate through the second opening, wherein the input-end component is directly electrically connected to the power board or electrically connected to the power board through an input board.

22. The power supply device according to claim 15, wherein the housing further comprises an upper plate, a left plate and a right plate, wherein the front plate and the rear plate are disposed opposite to each other along the first direction, the upper plate and the lower plate are disposed opposite to each other along a second direction, the left plate and the right plate are disposed opposite to each other along a third direction, and the accommodation space is collaboratively formed by the front plate, the rear plate, the upper plate, the lower plate, the left plate and the right plate, wherein the first direction, the second direction and the third direction are perpendicular to each other.

* * * * *